(12) United States Patent
Suzuki et al.

(10) Patent No.: US 9,217,860 B2
(45) Date of Patent: Dec. 22, 2015

(54) SPATIAL LIGHT MODULATION ELEMENTS, METHOD FOR MANUFACTURING SAME, AND SPATIAL LIGHT MODULATORS AND EXPOSURE APPARATUS COMPRISING SAME

(71) Applicant: Nikon Corporation, Chiyoda-ku (JP)

(72) Inventors: Yoshihiko Suzuki, Funabashi (JP); Junji Suzuki, Tama (JP); Hiroshi Konishi, Ichikawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 14/184,049

(22) Filed: Feb. 19, 2014

(65) Prior Publication Data

US 2014/0168751 A1    Jun. 19, 2014

Related U.S. Application Data

(63) Continuation of application No. PCT/JP2012/005268, filed on Aug. 22, 2012.

(30) Foreign Application Priority Data

Aug. 25, 2011    (JP) .................................. 2011-184036
Dec. 6, 2011    (JP) .................................. 2011-266769

(51) Int. Cl.
 *G02B 26/00*    (2006.01)
 *G02B 26/08*    (2006.01)
(52) U.S. Cl.
 CPC ............ *G02B 26/0833* (2013.01); *G02B 26/08* (2013.01); *Y10T 29/49885* (2015.01)
(58) Field of Classification Search
 CPC ............... G02B 26/08; G02B 26/0833; G02B 26/0841; G02B 26/001; Y10T 29/49885

USPC ............................ 359/290–292, 223.1, 224.1
 See application file for complete search history.

(56) References Cited

U.S. PATENT DOCUMENTS 5,629,794 A    5/1997    Magel et al.
6,512,625 B2 *    1/2003    Mei et al. ...................... 359/290
 (Continued)

FOREIGN PATENT DOCUMENTS

JP    3-210503    9/1991
JP    4-340905    11/1992
 (Continued)

OTHER PUBLICATIONS

International Search Report and Written Opinion for related International Patent Application No. PCT/JP2012/005268, 16 pages, Dec. 4, 2012.
 (Continued)

*Primary Examiner* — Tuyen Tra
(74) *Attorney, Agent, or Firm* — Klarquist Sparkman, LLP

(57) ABSTRACT

Provided is a spatial light modulation element comprising a substrate; a flat portion that is movable relative to the substrate; a flat board attached to the flat portion; and a dielectric film that is formed on a surface of the flat board opposite the surface on which the flat portion is attached, and reflects incident light. In the spatial light modulation element the dielectric film may include two or more types of dielectric layers that are repeatedly layered in an alternating manner, such that adjacent layers have different refractive indexes from each other. Furthermore, the dielectric film may be formed by alternately layering an $Al_2O_3$ film and a $SiO_2$ film.

24 Claims, 36 Drawing Sheets

(56) References Cited

U.S. PATENT DOCUMENTS

| | | | |
|---|---|---|---|
| 8,610,986 B2 * | 12/2013 | Jain et al. | 359/224.1 |
| 2006/0187528 A1 | 8/2006 | Hagood et al. | |
| 2012/0194890 A1 | 8/2012 | Park et al. | |

FOREIGN PATENT DOCUMENTS

| | | |
|---|---|---|
| JP | 4-350601 | 12/1992 |
| JP | 9-101467 | 4/1997 |
| JP | 2004-317653 | 11/2004 |
| JP | 2007-140109 | 6/2007 |
| JP | 2008-310043 | 12/2008 |
| JP | 2011-070096 | 4/2011 |
| JP | 2011-138046 | 7/2011 |
| KR | 10-2010-0101001 | 9/2010 |
| WO | WO 2011/080883 | 7/2011 |

OTHER PUBLICATIONS

Notice of Reasons for Rejection from related Japanese Application No. 2013-529877, dated Oct. 28, 2014, 5 pages with English translation.

Office Action for related Korean Patent Application No. 10-2013-7034127, 14 pages, dated Dec. 23, 2014.

Notice of Preliminary Rejection (with English translation) from related Korean Application No. 10-2013-7034127, dated Jul. 27, 2015, 6 pages.

* cited by examiner

SPATIAL LIGHT MODULATION ELEMENTS, METHOD FOR MANUFACTURING SAME, AND SPATIAL LIGHT MODULATORS AND EXPOSURE APPARATUS COMPRISING SAME

The contents of the following Japanese and International patent applications are incorporated herein by reference:
No. JP2011-184036 filed on Aug. 25, 2011,
No. JP2011-266769 filed on Dec. 6, 2011, and
No. PCT/JP2012/005268 filed on Aug. 22, 2012.

BACKGROUND

1. Technical Field

The present invention relates to a spatial light modulation element manufacturing method, a spatial light modulation element, a spatial light modulator, and an exposure apparatus.

2. Related Art

As shown in Japanese Patent Application Publication No. H09-101467, for example, there are spatial light modulation elements that are manufactured using lithography techniques, wherein a mirror supported by a torsion hinge is driven by electrostatic force to form a pattern in an irradiation light beam.

The spatial light modulation element is exposed to intense light, and therefore the characteristics of the spatial light modulation element are easily changed. Furthermore, a spatial light modulator experiences a performance from when the reflective film deteriorates during use after completion of the manufacturing process. Therefore, the spatial light modulator has an effectively short lifespan.

SUMMARY

According to a first aspect of the present invention, provided is a spatial light modulation element comprising a substrate; a flat portion that is movable relative to the substrate; a flat board attached to the flat portion; and a dielectric film that is formed on a surface of the flat board opposite the surface on which the flat portion is attached, and reflects incident light.

According to a second aspect of the present invention, provided is a spatial light modulation element comprising a substrate; a flat portion that pivots relative to the substrate; a dielectric multilayer film that pivots together with the flat portion, includes a plurality of dielectric layers that are layered in an alternating manner, and reflects incident light; and a protective layer that includes the same material as one of the dielectric layers, is thicker than this dielectric layer, and covers at least a portion of a surface of the one dielectric layer that is opposite the flat portion.

According to a third aspect of the present invention, provided is a spatial light modulation element comprising a substrate; a flat portion that pivots relative to the substrate; a dielectric multilayer film that pivots together with the flat portion, includes a plurality of dielectric layers that are layered in an alternating manner, and reflects incident light; and a protective layer that includes the same material as one of the dielectric layers and covers side surfaces of the dielectric multilayer film.

According to a fourth aspect of the present invention, provided is a spatial light modulator comprising a plurality of the spatial light modulation elements described above.

According to a fifth aspect of the present invention, provided is an exposure apparatus comprising the spatial light modulator described above.

According to a sixth aspect of the present invention, provided is a method of manufacturing a spatial light modulation element, comprising preparation of preparing a substrate and a flat portion that is movable relative to the substrate; deposition of depositing a dielectric film that reflects incident light on one surface of a flat board; and attachment of attaching the flat portion to a side of the flat board on which the dielectric film is not formed.

According to a seventh aspect of the present invention, provided is a method of manufacturing a spatial light modulation element, comprising formation of forming a support section and a flat portion that pivotally supports the support section, on a substrate; formation of forming a dielectric multilayer film that reflects incident light on one surface of the flat portion, in a state where at least one of the support section and the flat portion is in contact with a sacrificial layer; covering of covering at least a portion of a surface of the dielectric multilayer film with a protective layer that is resistant to an etchant used to remove the sacrificial layer, with the sacrificial layer being present; and removal of removing the sacrificial layer using the etchant, with the protective layer being present.

According to an eighth aspect of the present invention, provided is a spatial light modulation element manufactured according to the manufacturing method described above.

According to a ninth aspect of the present invention, provided is a spatial light modulator comprising a plurality of the spatial light modulation elements described above.

According to a tenth aspect of the present invention, provided is an exposure apparatus comprising the spatial light modulator described above.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
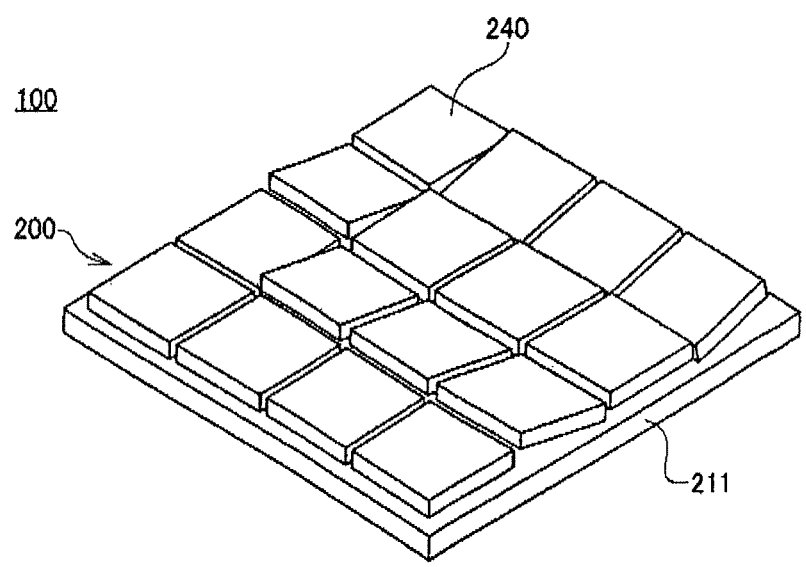
FIG. 1 is a schematic perspective view of the outside of a spatial light modulator 100.

FIG. 1 is a schematic perspective view of the outside of a spatial light modulator 100. The spatial light modulator 100 includes a substrate 211 and reflecting portions 240.

The plurality of reflecting portions 240, which are formed as a matrix arranged two-dimensionally on the substrate 211, each have a square reflective surface in which each edge is from several micrometers to hundreds of micrometers, and can pivot individually relative to the substrate 211. In this way, when some of the reflecting portions 240 pivot to be in an inclined state reflecting light, as shown in FIG. 1, the illumination distribution of the reflected light changes. By controlling the pivoting of the reflecting portions 240, a desired illumination distribution can be formed.

Figure 2:
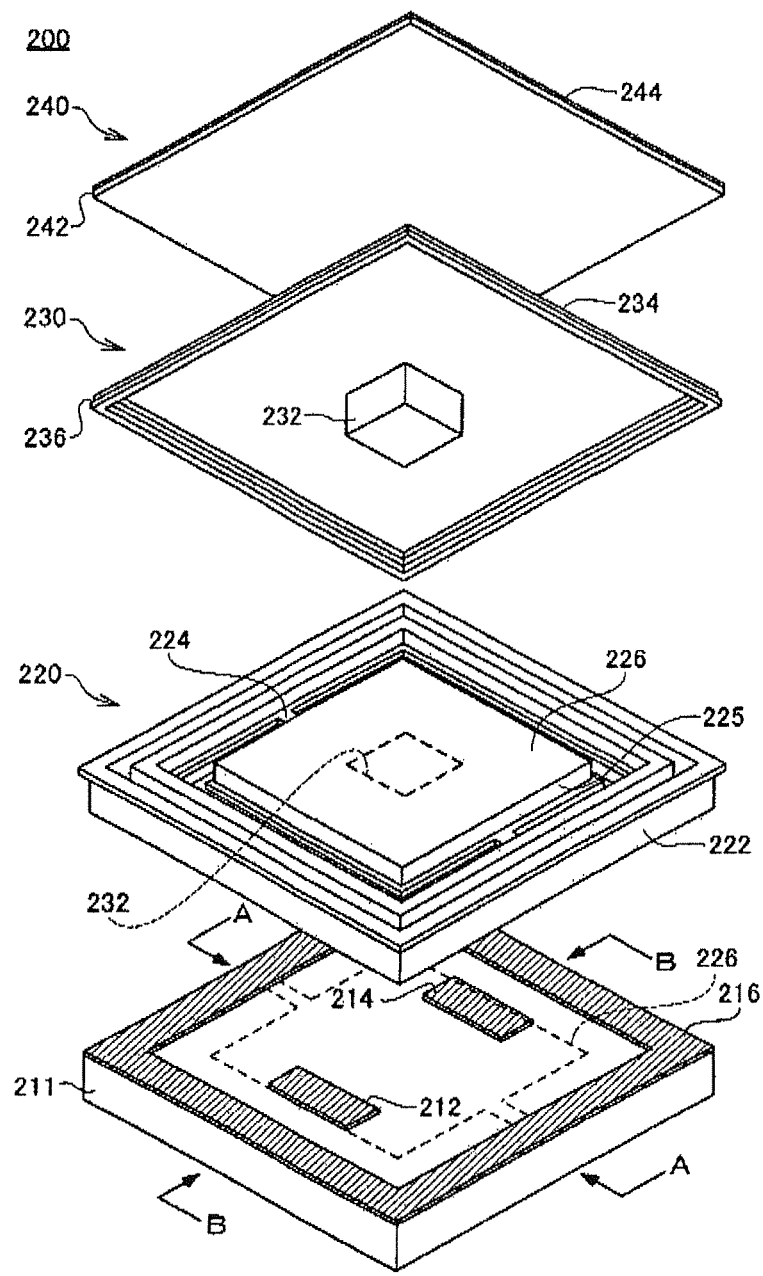
FIG. 2 is a schematic exploded perspective view of the spatial light modulation element 200.

FIG. 2 is a schematic exploded perspective view of the spatial light modulation element 200. The spatial light modulation element 200 is formed to correspond to one reflecting portion 240. In the spatial light modulator 100, the plurality of reflecting portions 240 have the same configuration. Each spatial light modulation element 200 includes a substrate 211, a drive section 220, a flat portion 230, and a reflecting portion 240.

The substrate 211 includes a plurality of electrodes 212, 214, and 216, and a CMOS circuit that supplies drive power to the electrodes 212 and 214. A large number of spatial light modulation elements 200 are arranged in the spatial light modulator 100, but the electrodes 216 are connected to a common potential such as a ground potential, and so the entire spatial light modulator 100 has a common reference potential.

The drive section 220 includes a secured frame 222 and a movable section 226 formed on the substrate 211. The secured frame 222 is formed by a hollow material with an open top surface, and forms a rectangular frame that surrounds the outer periphery of the spatial light modulation element 200. The secured frame 222 is formed above the electrode 216 on the substrate 211.

When the secured frame 222 is fixed to the substrate 211, the pair of electrodes 212 and 214 on the substrate 211 are positioned near the edge of the movable section 226, as shown by the dotted lines in FIG. 2. Accordingly, the bottom surface of the movable section 226 faces the electrodes 212 and 214.

On the inner side of the secured frame 222, the movable section 226 is supported on the inner surface of the secured frame 222 via a torsion shaft 224. One end of the torsion shaft 224 is fixed to the inner surface of the secured frame 222.

The other end of the torsion shaft 224 is fixed to a rib 225 extending downward from an edge portion of the movable section 226. The torsion shaft 224 exhibits elastic torsional deformation, and therefore the movable section 226 pivots relative to the substrate 211 with the torsion shaft 224 as the pivoting axis. However, the rib 225 has high bend strength, and therefore the movable section 226 is not easily deformed.

The bottom end of the rib 225 includes a flange portion the expands in an outward direction of the movable section 226. This portion is a region remaining when the layer including the rib 225 is patterned, and does not need to be included. However, the flange portion does not decrease the strength of the movable section 226 and instead enhances the strength, and therefore may remain.

The flat portion 230 includes a flat surface 234 and a post 232. The flat surface 234 forms a smooth and flat surface oriented upward in FIG. 2. The post 232 protrudes downward in FIG. 2, and is fixed to a substantial center of the movable section 226 shown by a dotted line in FIG. 2.

In this way, the flat portion 230 is distanced from the movable section 226, and also connected to the movable section 226. Furthermore, when the movable section 226 is pivoted relative the substrate 211, the flat portion 230 also pivots together with the movable section 226. The flat portion 230 may be formed of an oxide, nitride, or carbide deposited as a thin film, for example.

The flat portion 230 includes a rib 236 formed along the edge portion. In this way, the flat portion 230 has high bend strength exceeding the strength determined by the dimensions and material properties thereof.

The reflecting portion 240 includes a flat-plate section 242 and a dielectric film 244. The flat-plate section 242 is a smooth flat board, and is supported by the flat surface 234 of the drive section. Accordingly, when the flat portion 230 pivots, the flat-plate section 242 also pivots.

The dielectric film 244 is arranged on the top surface of the flat-plate section 242, and is supported by the flat-plate section 242. The dielectric film 244 is formed by alternately layering materials with different refractive indexes. Therefore, the dielectric film 244 has extremely high reflectivity for incident light. In other words, since the reflectivity with respect to incident light is high, a temperature increase resulting from the absorption of the energy of the incident light is small.

In this way, the spatial light modulator 100 including the spatial light modulation element 200 has a structure in which the flat portion 230 and the reflecting portion 240 are formed independently, and therefore separate manufacturing methods, materials, and configurations can be selected for the functioning thereof. Furthermore, since the reflecting portion 240 can be formed with a reflective surface area greater than the surface area of the flat portion 230, the reflection efficiency of the spatial light modulator 100 can be improved.

Figure 3:
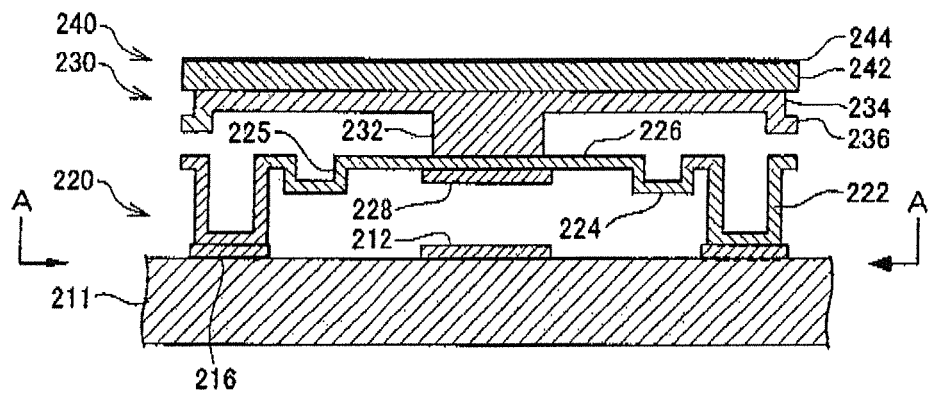
FIG. 3 is a cross-sectional view of the spatial light modulation element 200.

FIG. 3 is a schematic cross-sectional view of the spatial light modulation element 200. FIG. 3 shows the spatial light modulation element 200 in a state where the secured frame 222 is fixed to the substrate 211 and the flat portion 230 is fixed to the movable section 226, over the line A-A in FIG. 2. Components also shown in FIG. 2 are given the same reference numerals, and redundant descriptions are omitted.

As shown in FIG. 3, the movable section 226 includes an electrode 228 on the bottom surface thereof. The electrode 228 faces the electrode 212 on the substrate 211.

The movable section 226 includes a rib 225 extending downward from the edge portion. Therefore, the movable section 226 has high bend strength. On the other hand, the torsion shaft 224 does not include a component corresponding to the rib 225. Accordingly, when a drive force described further below is applied to the movable section 226, the torsion shaft 224 elastically deforms and the movable section 226 moves without deforming.

Figure 4:
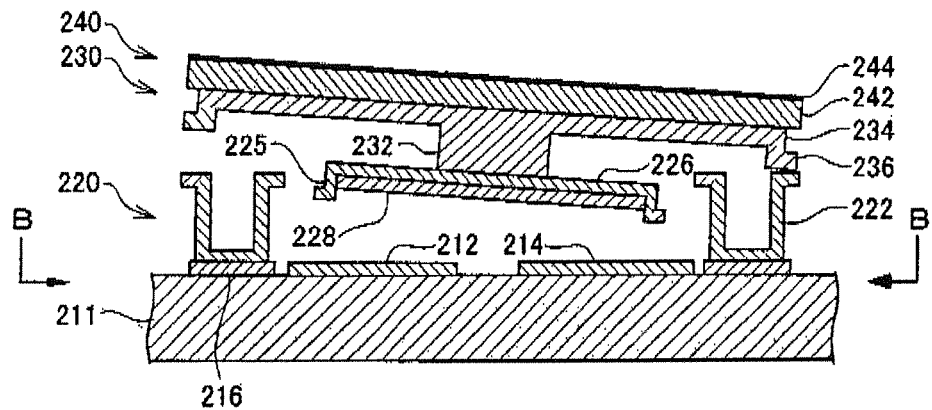
FIG. 4 is a cross-sectional view of the spatial light modulation element 200.

FIG. 4 is a schematic cross-sectional view of the spatial light modulation element 200, and shows the cross-section over B-B in FIG. 2. Components also shown in FIGS. 2 and 3 are given the same reference numerals, and redundant descriptions are omitted.

As shown in FIG. 4, the electrodes 212 and 214 on the substrate 211 each face a region near an edge of the movable section 226. Accordingly, when a drive voltage is applied to either of the electrodes 212 and 214, an electrostatic force acts on one of the ends of the electrode 228.

The movable section 226 is coupled to the secured frame 222 by the torsion shaft 224. Accordingly, when electrostatic force from one of the electrodes 212 and 214 acts on the electrode 228, the movable section 226 pivots with the torsion shaft 224 as the pivoting axis. As a result, the flat portion 230 fixed to the movable section 226 also pivots. Therefore, the reflecting portion 240 also pivots.

In the example shown in the drawings, when a drive voltage is applied to the electrode 214, the right side of the electrode 228 in the drawings is pulled toward the substrate 211. Therefore, the flat surface 234 of the flat portion 230 is pivoted to the right.

Returning to FIG. 1, by supplying and cutting off the drive power individually to each of the above structures in each reflecting portion 240, the pivoting of the plurality of reflecting portions 240 can each be controlled independently. Accordingly, a desired illumination pattern can be formed by causing the spatial light modulator 100 to reflect, and this configuration can be used in a variable light source, an exposure apparatus, an image display apparatus, or an optical switch, for example.

FIGS. 5 to 38 are cross-sectional views of a process for manufacturing the spatial light modulator 100 shown in FIGS. 1 to 4. FIGS. 5 to 17 show the process of forming the electrodes 212, 214, and 216 and the drive section 220 on the substrate 211. FIGS. 18 to 26 show the process of mounting the flat portion 230 on the drive section 220. FIGS. 27 to 33 show the process of manufacturing the reflecting portion 240. FIGS. 34 to 38 show the process of attaching the reflecting portion 240 to the flat portion 230.

Since a manufacturing process of the spatial light modulator 100 is shown in FIGS. 5 to 38, there are cases where corresponding components in the spatial light modulator 100 will have different shapes or states. Therefore, in FIGS. 5 to 38, a unique reference numeral is given to each component, and when a portion or all of a component is completed, the relationship of this component to the components of the spatial light modulator 100 shown in FIGS. 1 to 4 is explained.

Figure 5:
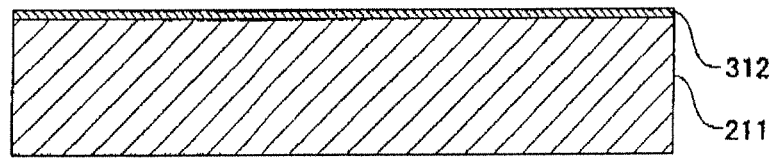
FIG. 5 is a cross-sectional view showing the process of manufacturing the spatial light modulator 100.

As shown in FIG. 5, a lower insulating layer 312 is deposited directly on the surface of the substrate 211 on which the spatial light modulator 100 is to be formed. In this way, the surface of the substrate 211 is covered by the insulating layer 312.

The substrate 211 can be a silicon monocrystalline substrate, or can be another widely used component having a flat surface, such as a compound semiconductor substrate or a ceramic substrate. A nitride or oxide of the material used for the substrate 211 can be used as the material for the insulating layer 312, for example. Furthermore, the insulating layer 312 may be a porous body with a high dielectric constant. The method for depositing the insulating layer 312 can be selected from among any type of physical vapor deposition or chemical vapor deposition, depending on the material for the insulating layer 312.

Figure 6:
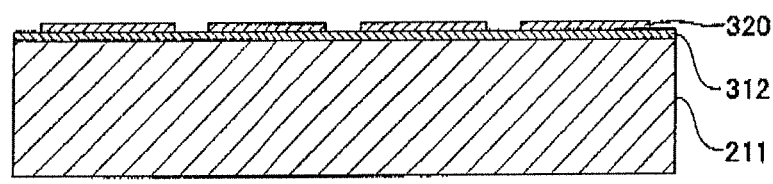
FIG. 6 is a cross-sectional view showing the process of manufacturing the spatial light modulator 100.

Next, as shown in FIG. 6, the patterned conductive layer 320 is formed on the insulating layer 312. The conductive layer 320 becomes the electrodes 212, 214, and 216 in the spatial light modulator 100. The material of the conductive layer 320 may be metal such as aluminum or copper. The method for depositing the conductive layer 320 can be selected from among physical vapor deposition, chemical vapor deposition, gold impregnation, or the like, according to the material used for the conductive layer 320.

Figure 7:
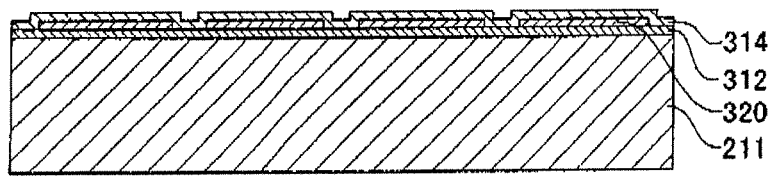
FIG. 7 is a cross-sectional view showing the process of manufacturing the spatial light modulator 100.

Next, as shown in FIG. 7, the surface of the conductive layer 320 and the surface of the lower insulating layer 312 exposed in the gaps between the pattern of the conductive layer 320 is covered by an upper insulating layer 314. At this time, the upper insulating layer 314 creates a corrugated shape, according to whether the conductive layer 320 is pressed below the upper insulating layer 314.

Figure 8:
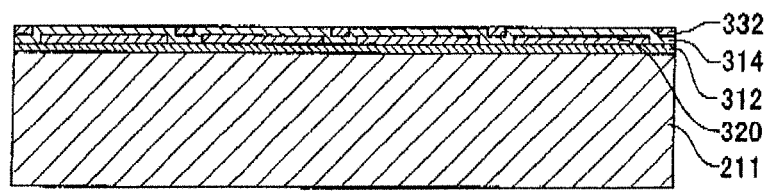
FIG. 8 is a cross-sectional view showing the process of manufacturing the spatial light modulator 100.

Next, as shown in FIG. 8, the corrugated shape formed by the surface of the upper insulating layer 314 is made flat by the resist layer 332. As a result, the process described below can be performed on a flat base. The method for applying the resist layer 332 can be selected from among spin coating, spray coating, or the like.

Figure 9:
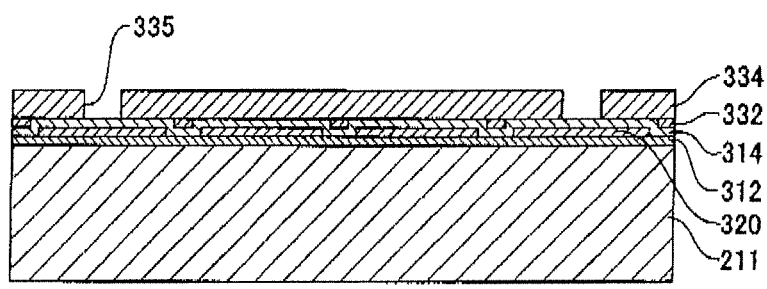
FIG. 9 is a cross-sectional view showing the process of manufacturing the spatial light modulator 100.

Next, as shown in FIG. 9, a deposition base is formed when forming a non-reflective film. The deposition base is formed of two layers, and at the stage shown in FIG. 9, the lower resist layer 334 is formed on the flattened insulating layer 314. The resist layer 334 can be patterned by sequentially performing the steps of applying a resist material, pre-baking, exposing, developing, and post-baking, thereby forming two pairs of side walls 335.

Figure 10:
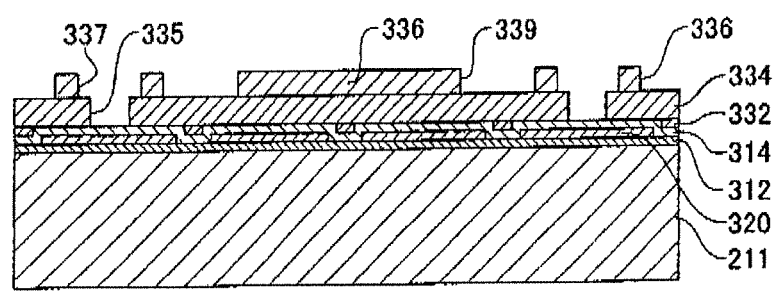
FIG. 10 is a cross-sectional view showing the process of manufacturing the spatial light modulator 100.

Next, as shown in FIG. 10, an upper resist layer 336 is formed on the lower resist layer 334. The resist layer 336 is also patterned, and in addition to the two pairs of side walls 337 formed respectively above the side walls 335 of the lower resist layer 334, another two pairs of side walls 339 are formed. As a result, when the surface of the resist layer 336 is viewed from above, shallow side walls 339 and deep side walls 337 and 335 are formed.

The lower and upper resist layers 334 and 336 can be patterned using photolithography. Specifically, the resist layers 334 and 336 are formed by a photosensitive material, and the shape of the resist layers 334 and 336 can be made as desired by performing exposure with a pattern set according to the design specifications. Furthermore, by using a dry etching technique such as plasma etching, the resist layers 334 and 336 may be patterned via machining.

It should be noted that patterning with photolithography is intended for a flat surface, and it is difficult, to form the stereoscopic deposition base needed to form the stereoscopic structure including the side walls 335, 337, and 339. Therefore, as shown in FIGS. 9 and 10, the stereoscopic deposition base can be formed by using the plurality of resist layers 334 and 336.

Figure 11:
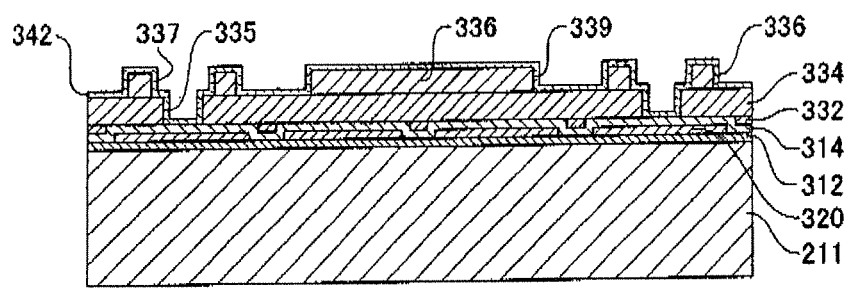
FIG. 11 is a cross-sectional view showing the process of manufacturing the spatial light modulator 100.

Next, as shown in FIG. 11, the non-conductive layer 342 is formed on the deposition base, which is formed by the insulating layer 314 and the resist layers 334 and 336. The formed non-conductive layer 342 has a stereoscopic shape corresponding to the shape of the resist layers 334 and 336. As a result, the structure of the thin film including the formed non-conductive layer 342 has a high cross-sectional two-dimensional moment.

Various oxides and nitrides can be used as the material of the non-conductive layer 342. The method for depositing the non-conductive layer 342 can be selected from among various types of physical vapor deposition and chemical vapor deposition, according to the material used for the non-conductive layer 342.

Figure 12:
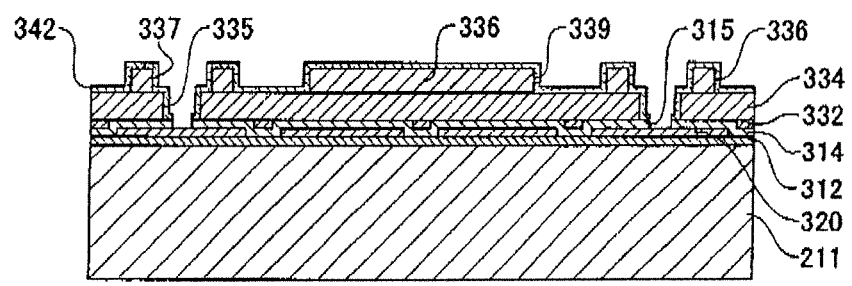
FIG. 12 is a cross-sectional view showing the process of manufacturing the spatial light modulator 100.

Next, as shown in FIG. 12, the bottom surfaces within the side walls 335 and 337 of the resist layers 334 and 336 are removed, thereby forming the contact hole 315 reaching the conductive layer 320. The contact hole 315 can be formed by dry etching, for example.

Figure 13:
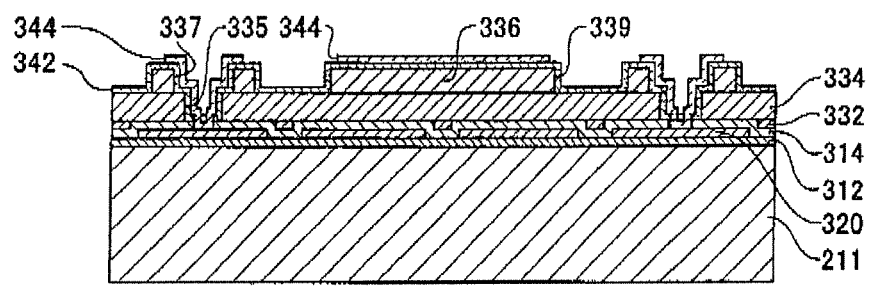
FIG. 13 is a cross-sectional view showing the process of manufacturing the spatial light modulator 100.

Next, as shown in FIG. 13, the patterned conductive layer 344 is formed on the non-conductive layer 342. In this way, a pair of pillar-shaped structures reaching from inside the contact hole 315 to the top of the side walls 335 and 337 and a flat surface formed on the land of the resist layer 336 between the side walls 339 remain as the conductive layer 344. The structure of the conductive layer 344 formed within the side walls 335 and 337 is electrically connected to one of the lands of the conductive layer 320.

Figure 14:
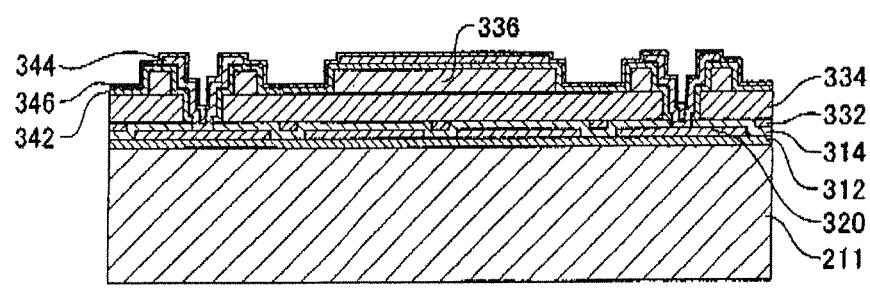
FIG. 14 is a cross-sectional view showing the process of manufacturing the spatial light modulator 100.

Next, as shown in FIG. 14, the conductive layer 346 is formed covering the entire surface of the non-conductive layer 342 and conductive layer 344. In this way, the patterned conductive layer 344 is electrically connected by the current conductive layer 346. The material of the conductive layer 346 may be the same as the material of the conductive layer 344, or may be a different material.

Figure 15:
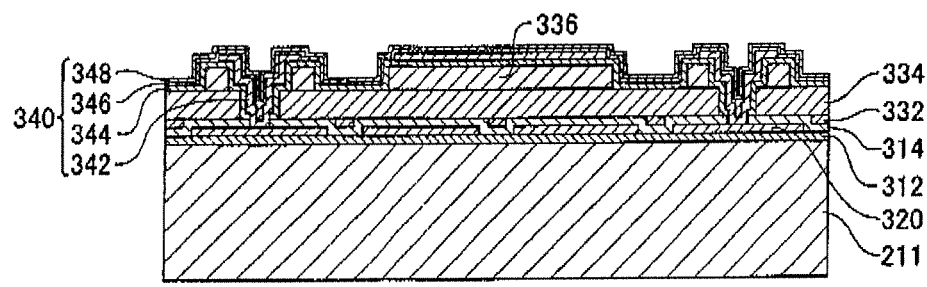
FIG. 15 is a cross-sectional view showing the process of manufacturing the spatial light modulator 100.

Next, as shown in FIG. 15, the upper non-conductive layer 348 is formed covering the entire surface of the conductive layer 346. The upper non-conductive layer 348 is formed of the same material as the non-conductive layer 342 positioned below the conductive layers 344 and 346. The deposition method can be the same as used for the lower non-conductive layer 342.

In this way, the opaque film 340 is formed as a three-layer structure by the lower non-conductive layer 342, the conductive layers 344 and 346, and the upper non-conductive layer 348, all of which have the same pattern shape. Since the non-conductive layers 342 and 348 are formed without any optical functions being applied to the surface of the opaque film 340, this entire three-layer structure is referred to as the opaque film 340, in order to differentiate it from other film structures. However, this does not mean that this structure was formed in order to have predetermined optical characteristics.

The opaque film 340 includes the non-conductive layers 342 and 348 formed with the same material on the front and back surfaces, and therefore the bimetal effect occurring between the conductive layers 344 and 346 and the non-conductive layers 342 and 348 due to temperature change is cancelled out. As a result, the shape of the opaque film 340 is stabilized. Furthermore, since the overall opaque film 340 is formed using the same material as the flat film described further below, there is no thermal expansion difference with respect to the flat film.

Figure 16:
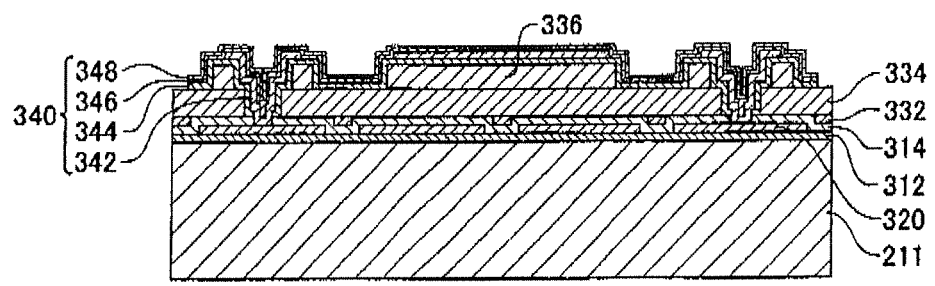
FIG. 16 is a cross-sectional view showing the process of manufacturing the spatial light modulator 100.

Next, as shown in FIG. 16, a portion of the opaque film 340 is removed, thereby forming the outer shape of the drive section 220. In this way, at the ends of the opaque film 340, the resist layer 334 is exposed as the layer below the opaque film 340. The opaque film 340 can be patterned using dry etching. In this way, the structures of the substrate 211 and the drive section 220 shown in FIG. 2 are formed.

Figure 17:
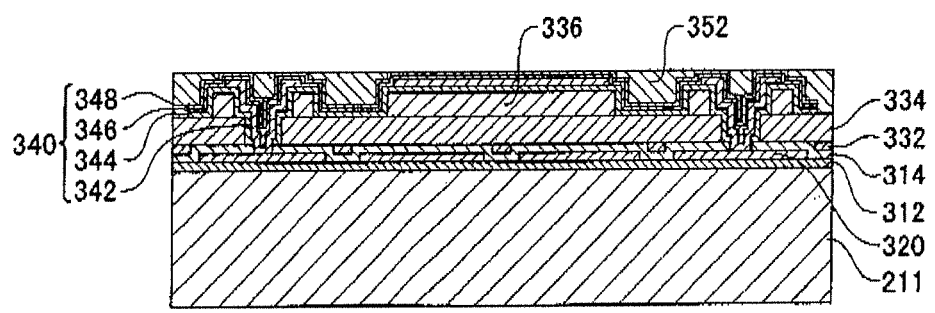
FIG. 17 is a cross-sectional view showing the process of manufacturing the spatial light modulator 100.

Next, as shown in FIG. 17, the top surface of the opaque film 340, i.e. the surface of the non-conductive layer 348, is flattened by the resist layer 352. In this way, the existing structure of the drive section 220 is protected, and a stage of attaching a reflective mirror described further below is included. The method for applying the resist layer 332 can be selected from among spin coating, spray coating, or the like.

Figure 18:
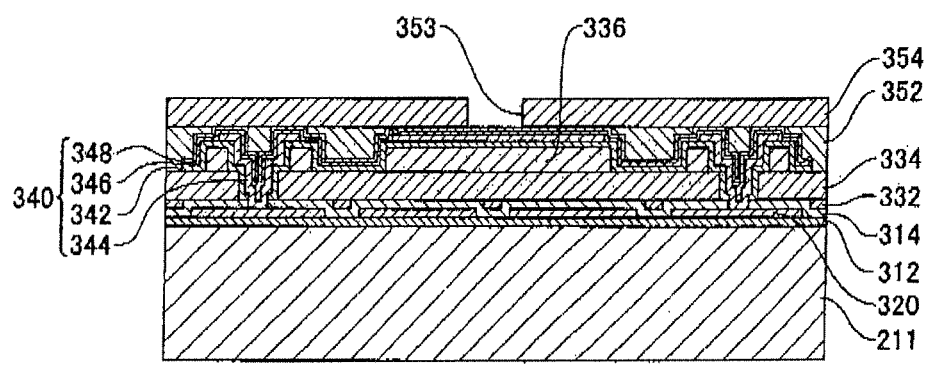
FIG. 18 is a cross-sectional view showing the process of manufacturing the spatial light modulator 100.

Next, the deposition base is again generated by a two-layer resist structure. Specifically, as shown in FIG. 18, a lower resist layer 354 of the two-layer structure is formed on the surface of the flattened resist layer 352 and non-conductive layer 348. Furthermore, the resist layer 354 is patterned, thereby forming the side wall 353 in the substantial center thereof.

Figure 19:
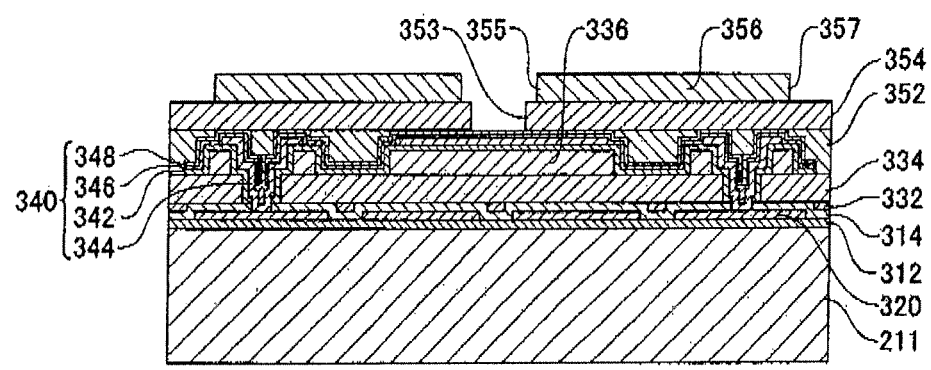
FIG. 19 is a cross-sectional view showing the process of manufacturing the spatial light modulator 100.

Next, as shown in FIG. 19, the upper resist layer 356 of the two-layer structure is formed on the lower resist layer 354. The upper resist layer 356 is also patterned to include a side wall 355 formed above the side wall 353 of the lower resist layer 354 and a side wall 357 formed near the far end of the device. In this way, the resist layers 354 and 356 form the stereoscopic deposition based.

Figure 20:
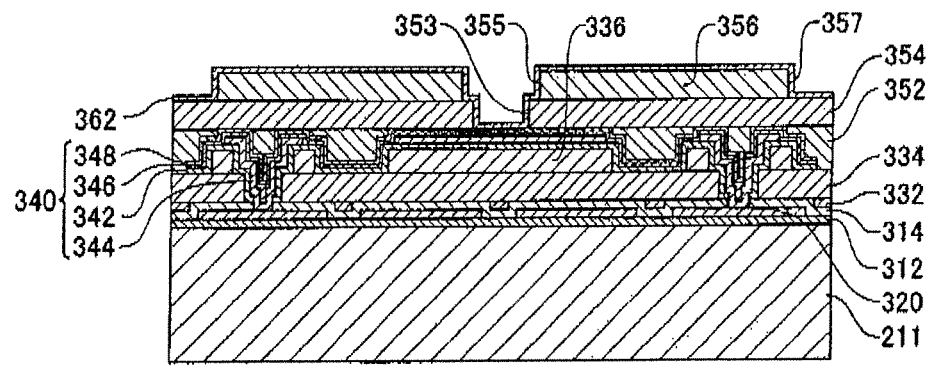
FIG. 20 is a cross-sectional view showing the process of manufacturing the spatial light modulator 100.

Next, as shown in FIG. 20, the non-conductive layer 362 is formed over the entire surface of the resist layers 354 and 356. At this time, the non-conductive layer 362 is connected to the surface of the opaque film 340 within the side walls 353.

Various oxides, nitride, or carbides, including $SiN_x$, for example, can be used as the material of the non-conductive layer 362. The method for depositing the non-conductive layer 342 can be selected from among any type of physical vapor deposition or chemical vapor deposition, depending on the material for the non-conductive layer 342.

Figure 21:
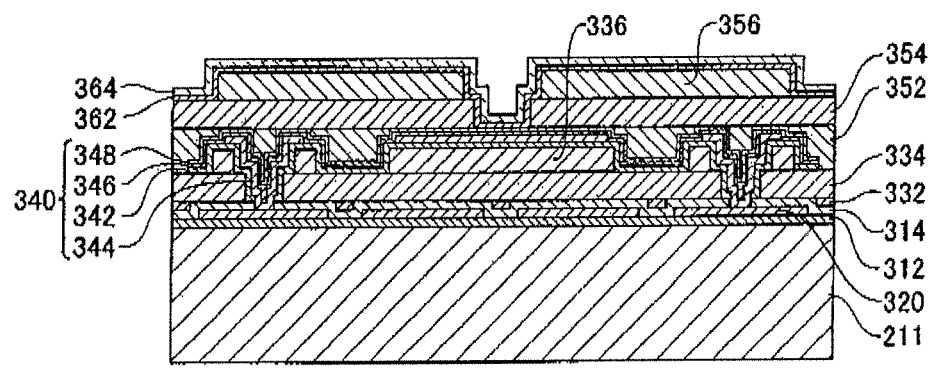
FIG. 21 is a cross-sectional view showing the process of manufacturing the spatial light modulator 100.

Next, as shown in FIG. 21, the flat structure layer 364 is formed over the entire surface of the non-conductive layer 362. The flat structure layer 364 is preferably selected from among materials that have good familiarity with the material of the post 232 of the reflecting portion 240 connected to the flat portion 230.

The flat structure layer 364 may be formed of the same material as the opaque film 340 or the non-conductive layers 342 and 348, e.g. aluminum. The method for forming the flat structure layer 364 can be selected from among any type of physical vapor deposition or chemical vapor deposition, depending on the material for the flat structure layer 364.

Figure 22:
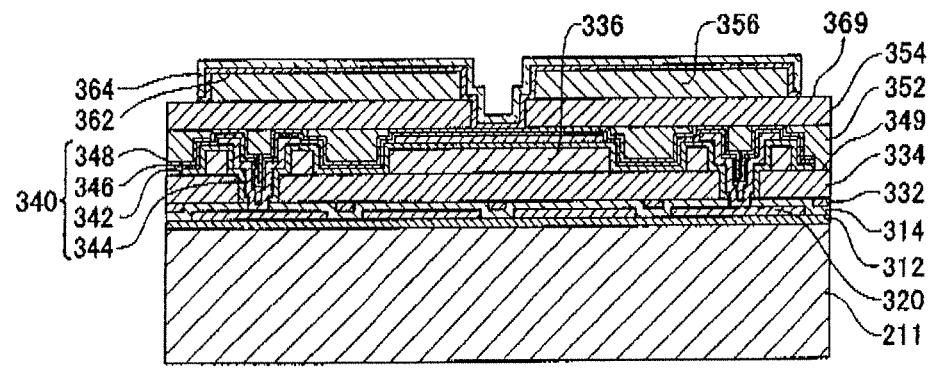
FIG. 22 is a cross-sectional view showing the process of manufacturing the spatial light modulator 100.

Next, as shown in FIG. 22, the edges of the non-conductive layer 362 and the flat structure layer 364 are removed, thereby forming the outer shape of the flat portion 230. In this way, the resist layer 354 is exposed at the ends of the non-conductive layer 362 and flat structure layer 364, as the layer below the non-conductive layer 362. The non-conductive layer 362 and the flat structure layer 364 can be patterned using dry etching.

Figure 23:
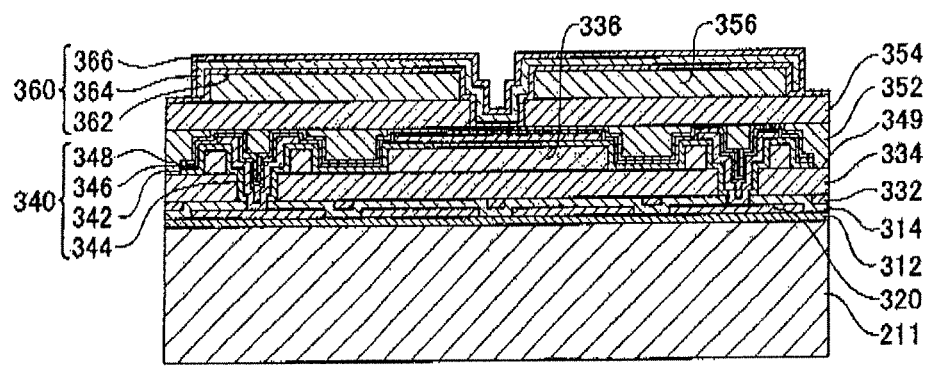
FIG. 23 is a cross-sectional view showing the process of manufacturing the spatial light modulator 100.

Next, as shown in FIG. 23, the non-conductive layer 366 is deposited on the surface of the flat structure layer 364 and the exposed surface of the resist layer 354. In this way, the three-layer structure is formed including the lower non-conductive layer 362, the flat structure layer 364, and the upper non-conductive layer 366.

In the same manner as the opaque film 340, by farthing this three-layer structure, the bimetal effect between the non-conductive layers 362 and 366 and the flat structure layer 364 is cancelled out. Accordingly, the shape becomes stable with respect to the effect of internal stress caused by temperature change. It should be noted that the structure of the flat film 360 is not limited to a three-layer structure, and may be a single layer structure or a structure with more than three layers, as long as there is a material on the surface thereof that has surface characteristics suitable for bonding with the reflecting portion 240 described further below.

Figure 24:
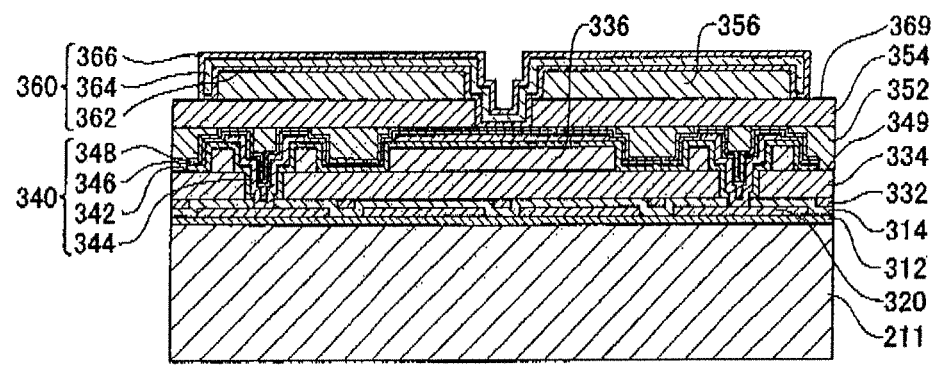
FIG. 24 is a cross-sectional view showing the process of manufacturing the spatial light modulator 100.

Next, as shown in FIG. 24, the outer edge of the flat film 360 is formed by removing the edge portion of the non-conductive layer 366. The non-conductive layer 366 can be patterned by dry etching. In this way, the resist layer 354 is exposed at the ends of the flat film 360, as the layer positioned below the non-conductive layer 362.

Figure 25:
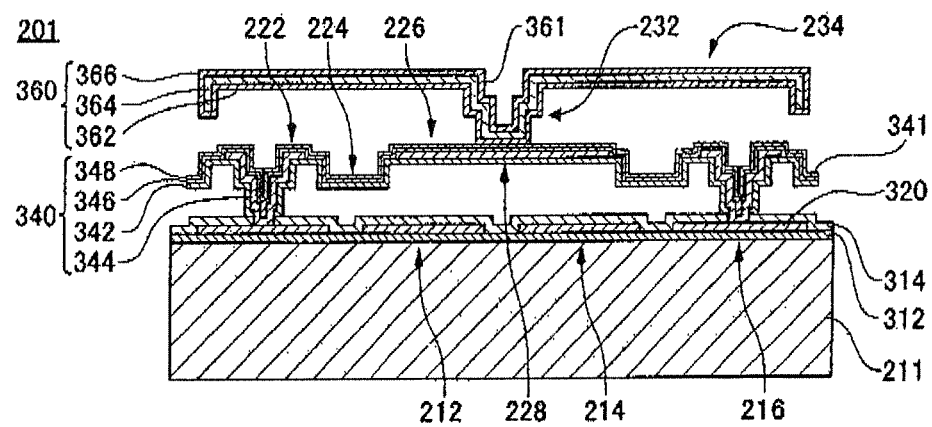
FIG. 25 is a cross-sectional view of the lower structure 201.

FIG. 25 is a cross-sectional view of the lower structure 201 manufactured by the steps up to FIG. 24. In FIG. 25, the resist layers 332, 334, 336, 352, 354, and 356 are removed, and the manufactured lower structure 201 is shown alone.

It should be noted that at this stage in the manufacturing of the spatial light modulator 100, in order to protect the lower structure 201 during the following steps, the resist layers 332, 334, 336, 352, 354, and 356 shown up to FIG. 22 are left in. Furthermore, to simplify the description, the resist layers 332, 334, 336, 352, 354, and 356 are referred to collectively as the resist layer 350 in the following description.

In the lower structure 201, the conductive layer 320 on the substrate 211 corresponds to one of the electrodes 212, 214, and 216. The center portion of the opaque film 340 corresponds to the movable section 226. The conductive layer 344 positioned on the bottom surface of the portion corresponding to the movable section 226 corresponds to the electrode 228. The portion positioned on the outer side of the portion corresponding to the movable section 226 corresponds to the pair of torsion shafts 224. The outside of the portion corresponding to the torsion shafts 224 corresponds to the secured frame 222.

In the lower structure 201, the flat film 360 corresponds to the flat portion 230 in the spatial light modulator 100. The bottom surface of the sunken portion 361 formed in the center portion of the flat film 360 corresponds to the post 232 of the flat portion 230. The top surface of the flat film 360 corresponds to the flat surface 234.

The ends of the opaque film 340 extend horizontally farther outward than the portion serving as the secured frame 222. This portion forms the light-blocking portion 341 for blocking the light directed toward the substrate 211 from the gaps between adjacent spatial light modulation elements 200. As a result, degradation of the CMOS elements or the like on the substrate 211 due to incident light can be prevented.

Figure 26:
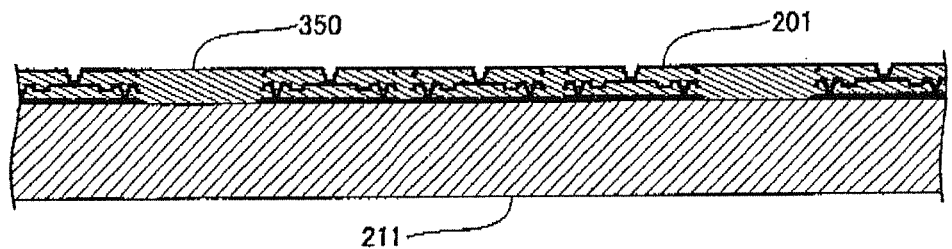
FIG. 26 is a cross-sectional view showing the process for manufacturing the reflecting portion 240.

FIG. 26 is a schematic view of the state of the substrate 211 on which the lower structure 201 described above is formed. As shown in FIG. 26, a plurality of the lower structures 201 are formed on the substrate 211 en bloc.

The lower structures 201 form a plurality of groups, and each group is used to form one spatial light modulator 100. Therefore, a large number of spatial light modulators 100 can be manufactured en bloc by applying a wafer process to a single substrate 211. At the stage shown in FIG. 26, each lower structure 201 is buried in the resist layer 350, and the surface of the resist layer 350 and the surface of the exposed flat surface 234 are substantially the same plane.

Figure 27:
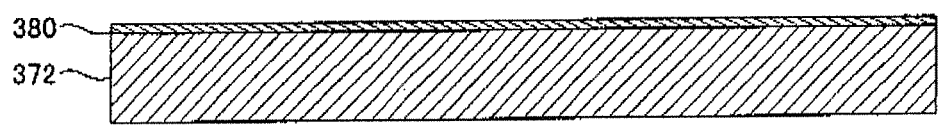
FIG. 27 is a cross-sectional view showing the process for manufacturing the reflecting portion 240.

Next, the process of manufacturing the reflecting portion 240 will be described, with reference to FIGS. 27 to 33. First, as shown in FIG. 27, the dielectric film 380 is formed on the surface of a prepared bulk substrate 372. The bulk substrate 372 is a silicon crystal substrate, for example, and has the surface property of being very smooth. Accordingly, a high quality dielectric layer can be formed as the reflective film on the surface of the bulk substrate 372.

Figure 28:
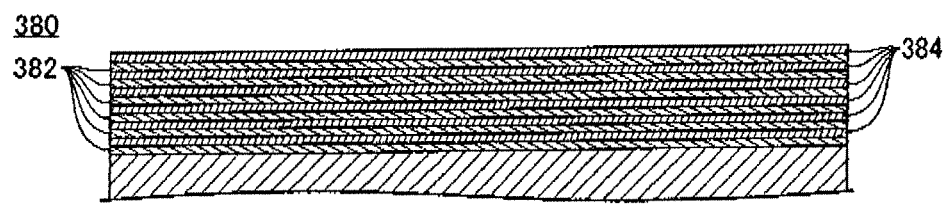
FIG. 28 is a cross-sectional view of the dielectric film 380.

FIG. 28 is a cross-sectional view of the dielectric film 380. As shown in FIG. 28, the dielectric film 380 if formed by alternately layering two or more types of dielectric thin films with different refractive indexes, e.g. an $Al_2O_3$ thin film 382 and a $SiO_2$ thin film 384. The set of the $Al_2O_3$ thin film 382 and the $SiO_2$ thin film 384 can be formed tens of times, or even more. The deposition method for the dielectric film 380 can be ion beam sputtering, for example, but is not limited to this method.

Unavoidable residual stress occurs in the dielectric film 380 formed on the bulk substrate 372. Accordingly, by annealing the bulk substrate 372 with the dielectric film 380 deposited thereon, the residual stress can be greatly reduced. As a result, the stability of the dielectric film 380 is improved when being repeatedly heated and cooled during use, and the lifetime of the spatial light modulator 100 can be extended.

Figure 29:
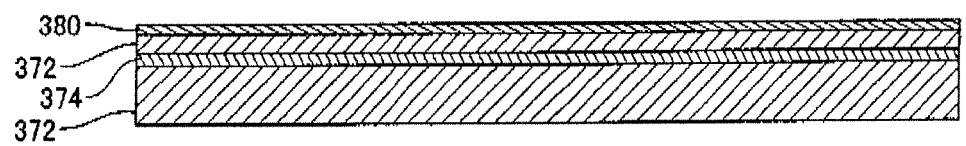
FIG. 29 is a cross-sectional view showing the process for manufacturing the reflecting portion 240.

Next, as shown in FIG. 29, the release layer 374 is formed within the bulk substrate 372 parallel to the surface thereof. The release layer 374 can be formed by injecting hydrogen ions into the bulk substrate 372, using an ion injection technique.

Figure 30:
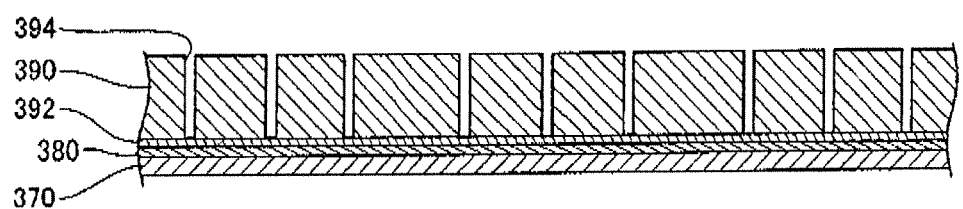
FIG. 30 is a cross-sectional view showing the process for manufacturing the reflecting portion 240.

Next, as shown in FIG. 30, the dummy substrate 390 is tentatively attached on the dielectric film 380, via a tentative adhesive layer 392. Furthermore, by applying a load with the bulk substrate 372 including the dielectric film 380 in a heated state, the bulk substrate 372 is divided in the thickness direction, with a release layer 374 as the cleavage plane. As a result, the thin flat board film 370 remains on the dielectric film 380 side.

The flat board film 370 may be formed by thinning the bulk substrate 372 through mechanical polishing or chemical mechanical polishing. A flat board film 370 formed by a smart cut technique may be further thinned by mechanical polishing or chemical mechanical polishing.

The tentative adhesive layer 392 can be formed by a resist material, for example. Furthermore, a through-hole 394 passing through the dummy substrate 390 in the thickness direction may be provided. The through-hole 394 can be used when the dummy substrate 390 is removed in a later, step.

Figure 31:
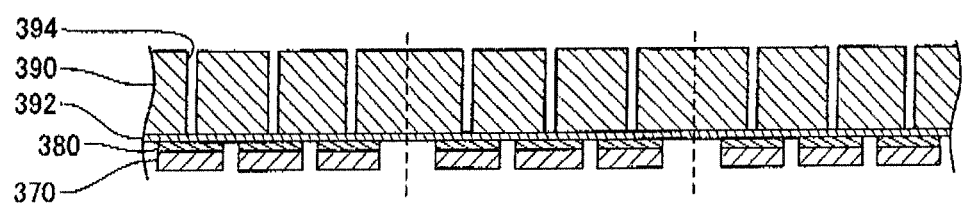
FIG. 31 is a cross-sectional view showing the process for manufacturing the reflecting portion 240.

Next, as shown in FIG. 31, the flat board film 370 and the dielectric film 380 held by the dummy substrate 390 are patterned according to the shape of the reflecting portion 240 in the spatial light modulator 100. The patterning method can be selected from various types of dry etching or wet etching.

Figure 32:
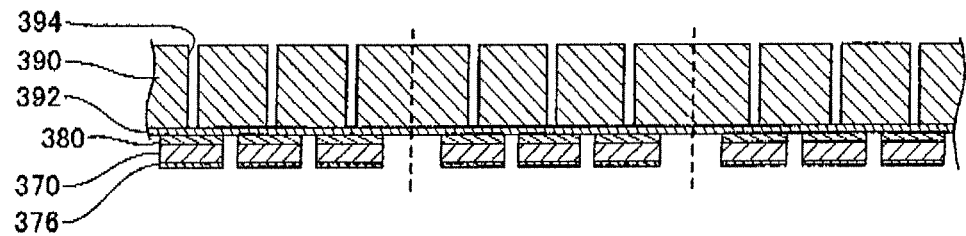
FIG. 32 is a cross-sectional view showing the process for manufacturing the reflecting portion 240.

Next, as shown in FIG. 32, the bonding layer 376 is formed on each bottom surface of the patterned flat board film 370. Alloy materials such as Sn—Cu, Sn—Ag, Sn—Zn, Sn—Pb, Sn—Bi, Sn—Zn—Bi, or Sn—Au can be used as the material for the bonding layer 376.

In the above example, the bonding layer 376 is provided after the flat board film 370 is patterned. However, the bonding layer 376 may be formed on the flat board film 370 prior to the patterning, and then the bonding layer 376 may be patterned together with the flat board film 370.

Figure 33:
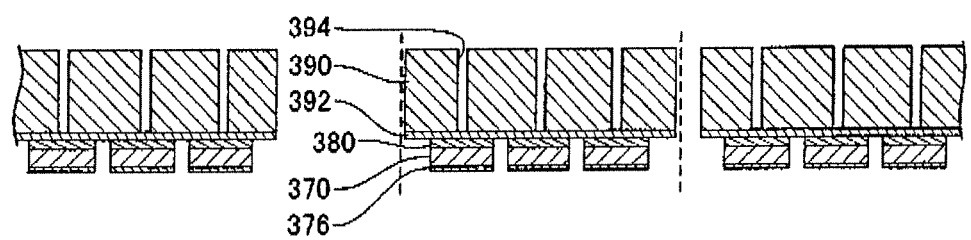
FIG. 33 is a cross-sectional view showing the process for manufacturing the reflecting portion 240.

Next, as shown in FIG. 33, the dummy substrate 390 is diced. As a result, the chips of the flat board film 370 and the dielectric film 380 held by the dummy substrate 390 are divided to correspond to a single spatial light modulator 100, and the held by the divided dummy substrate 390.

Figure 34:
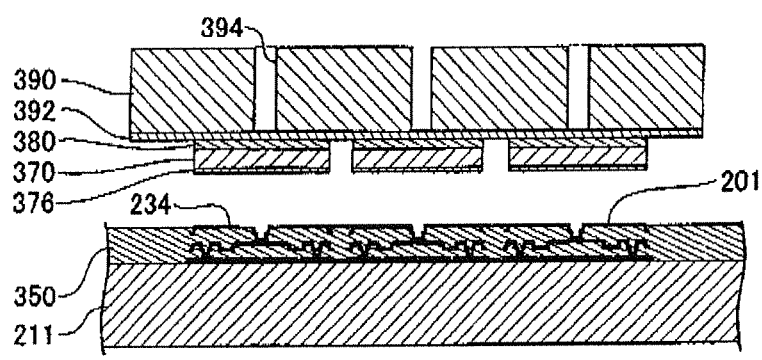
FIG. 34 is a cross-sectional view showing the process of manufacturing the spatial light modulator 100.

FIGS. 34 to 38 show the steps of assembling the spatial light modulator 100. First, as shown in FIG. 34, the flat board film 370 and the dielectric film 380 held by the dummy substrate 390 are aligned with the lower structure 201 formed on the substrate 211.

Figure 35:
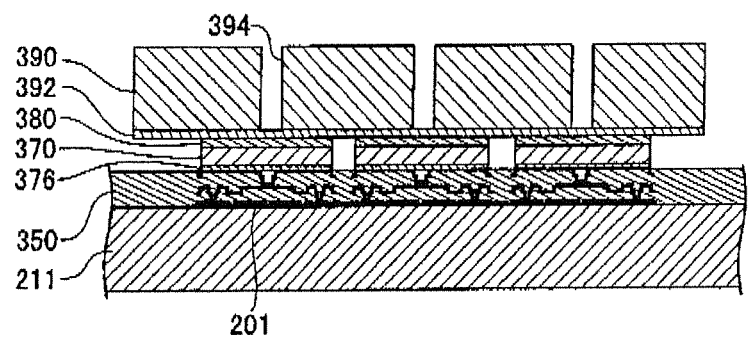
FIG. 35 is a cross-sectional view showing the process of manufacturing the spatial light modulator 100.

Next, as shown in FIG. 35, the bonding layer 376 in a molten state is collided with the flat surface 234 of the lower structure 201, thereby bonding the flat board film 370 and the flat surface 234. As a result, the flat board film 370 and the flat surface 234 are formed integrally.

Figure 36:
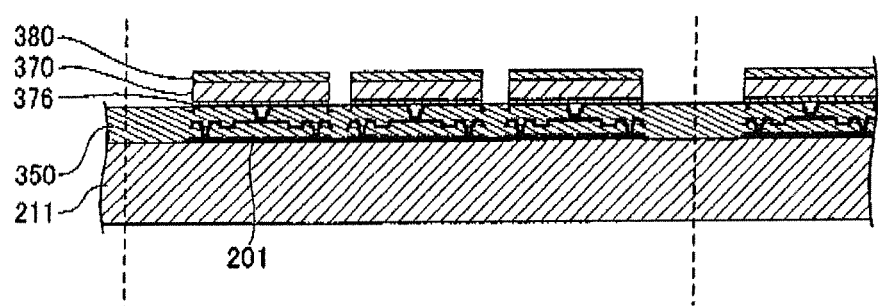
FIG. 36 is a cross-sectional view showing the process of manufacturing the spatial light modulator 100.

Next, as shown in FIG. 36, the dummy substrate 390 is removed. Here, the dummy substrate 390 can be removed by melting the tentative adhesive layer 392. The solvent passes through the through-hole 394 of the dummy substrate 390 to also act on the portion contacting the dielectric film 380.

In this way, on the substrate 211, the flat board film 370 is bonded on the lower structure 201, and the dielectric film 380 is exposed facing upward on the surface of the flat board film 370. The dielectric film 380 corresponds to the dielectric film 244 shown in FIGS. 2 to 4, and becomes the reflecting portion 240 of the spatial light modulator 100.

Figure 37:
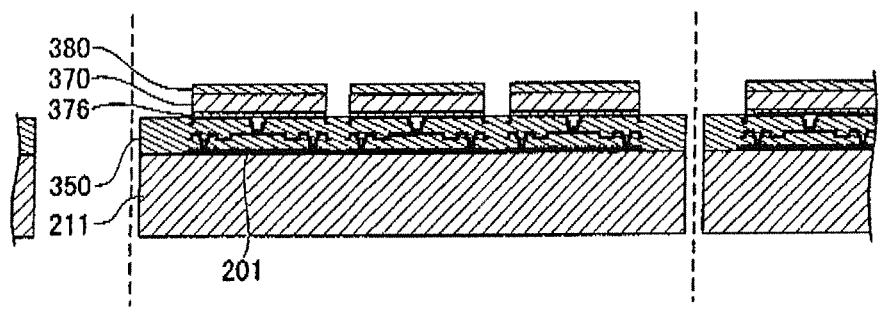
FIG. 37 is a cross-sectional view showing the process of manufacturing the spatial light modulator 100.
Figure 38:
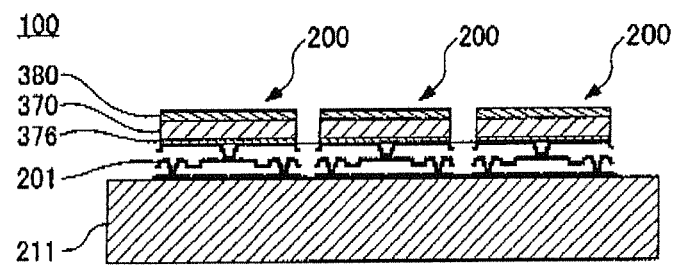
FIG. 38 is a cross-sectional view showing the process of manufacturing the spatial light modulator 100.

Next, as shown in FIG. 37, the substrate 211 is divided into individual spatial light modulators 100 through dicing. Next, as shown in FIG. 38, the resist layer 350 protecting the lower structure 201 is removed.

Here, with reference to FIG. 22 again, the surface of the resist layer 354 is exposed at the ends of the flat film 360. The resist layer 356 that is inside the flat film 360 is layered on the resist layer 354, and therefore these layers are continuous.

The resist layer 354 is layered on the resist layer 352, and therefore these layers are continuous. The resist layer 352 and the resist layers 334 and 332 are continuous at the ends of the opaque film 340. Furthermore, the resist layer 336 positioned inside the opaque film 340 is layered on the resist layer 334, and therefore these layers are continuous.

In this way, all of the resist layers 332, 334, 336, 352, 354, and 356 are continuous, and therefore can be removed en bloc from the state shown in FIG. 37. Accordingly, there is no need to provide an etching hole for removing the resist in the flat film 360 forming the flat surface 234.

The removal of the resist layers 332, 334, 336, 352, 354, and 356 may be achieved with a wet process using a dissolving material. Instead, a dry process may be applied through carbonization using plasma. Furthermore, the resist layers 332, 334, 336, 352, 354, and 356 are merely an example of the layers of sacrificial materials, and a similar process can be applied using other sacrificial materials.

In this way, the spatial light modulator 100 having the same structure as the spatial light modulator 100 shown in FIGS. 1 to 4 can be manufactured using lithography techniques. Since a very fine spatial light modulation element 200 can be manufactured by using lithography techniques, the spatial light modulator 100 can be manufactured to have high resolution.

The dielectric film 380 formed serving as the reflective surface of the reflecting portion 240 is manufactured independently from the lower structure 201, and therefore the deposition conditions of the dielectric film 380 can be optimized and the annealing can be performed after the deposition to reduce the residual stress. As a result, the spatial light modulator 100 can be manufactured with high stability with respect to its thermal history.

Furthermore, the dielectric film 380 formed on the flat board film 370 can serve as-is as the reflective surface. Accordingly, the dielectric film 380 serving as the reflective surface can also be made flat, thereby expanding the effective reflective surface area of the spatial light modulator 100.

The combination of the materials in each layer can be exemplified by forming the conductive layers 320, 344, and 346 of aluminum and forming the non-conductive layers 342 and 348 and flat structure layer 364 of silicon nitride. It should be noted that the material of each portion is not limited to this, and can instead be selected as needed from among $SiO_x$, $SiN_x$, Al, Cr, Al alloys, or the like, for example.

In the above example, a plurality of reflecting portions 240 are mounted on each spatial light modulator 100, which are on a substrate 211 having a plurality of lower structures 201 formed thereon. However, instead of dicing the dummy substrate 390 holding the reflecting portions 240 formed en bloc, the substrate 211 of the lower structure 201 and the substrate of the reflecting portion 240 may be attached to each other en bloc.

Instead, the substrate 211 on the lower structure 201 side may be diced to form each spatial light modulator 100, and attached to the reflecting portion 240 in a so-called chip-to-chip manner. Furthermore, units of single lower structures 201 may be used, and the reflecting portions 240 may be divided and mounted independently. The selection for the method of assembly can be made according to the desired precision for the completed spatial light modulators 100 with respect to the manufacturing yield of the lower structures 201 and the reflecting portions 240, for example.

Figure 39:
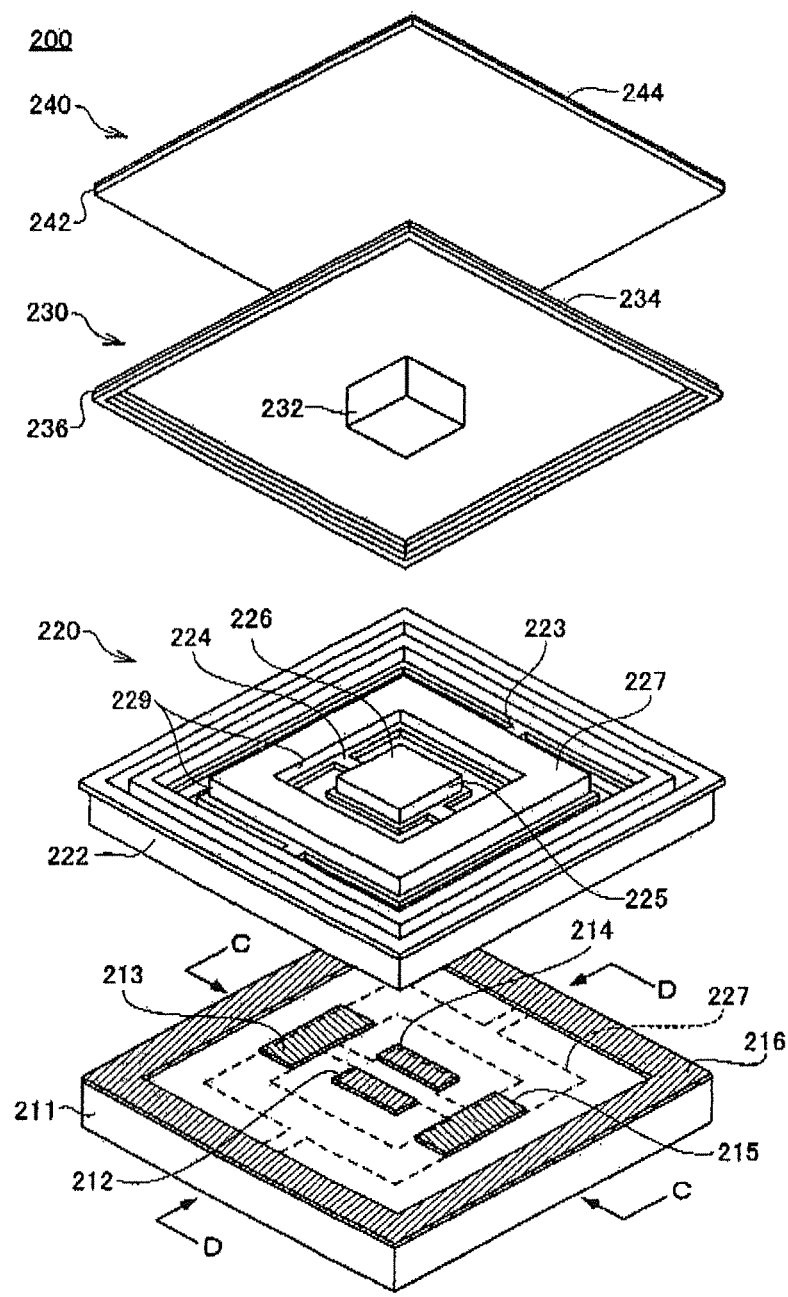
FIG. 39 is an exploded perspective view of the spatial light modulation element 200.

FIG. 39 is a schematic exploded perspective view of a spatial light modulation element 200 having a different configuration. This spatial light modulation element 200 has the same configuration as the spatial light modulation element 200 shown in FIG. 2, aside from the points described below. Components that are the same as those in FIG. 1 are given the same reference numerals, and redundant descriptions are omitted.

The spatial light modulation element 200 includes a drive section 220, a flat portion 230, and a reflecting portion 240 stacked on the substrate 211. The reflecting portion 240 has the same shape as in the spatial light modulation element 200 shown in FIG. 1. On the other hand, in addition to the electrodes 212, 214, and 216, another pair of electrodes 213 and 215 are formed on the surface of the substrate 211.

The drive section 220 further includes a movable frame 227 that is concentrically between the secured frame 222 and the movable section 226. The movable frame 227 is supported from the secured frame 222, via a pair of torsion shafts 223. As a result, the movable frame 227 pivots relative to the secured frame 222, with the torsion shafts 223 as a pivoting axis. The torsion shafts 223 are orthogonal to the torsion shafts 224.

One end of each torsion shaft 224 supporting the movable section 226 is connected to the inside of the movable frame 227. As a result, the movable section 226 pivots relative to the movable frame 227, with the torsion shafts 224 as a pivoting axis. Accordingly, the movable section 226 pivots on the two torsion shafts 223 and 224 that are orthogonal to each other, relative to the secured frame 222.

The movable frame 227 has ribs 229 that extend downward, from the inner and outer edges thereof. As a result, the movable frame 227 has high bend strength and twist strength. Accordingly, when the movable frame 227 and the movable section 226 pivot independently and the torsion shafts 223 and 224 deform elastically, the movable frame 227 and the movable section 226 barely deform. Furthermore, when internal stress such as the reduction in residual stress acts, the movable frame 227 and the movable section 226 are more difficult to deform.

Figure 40:
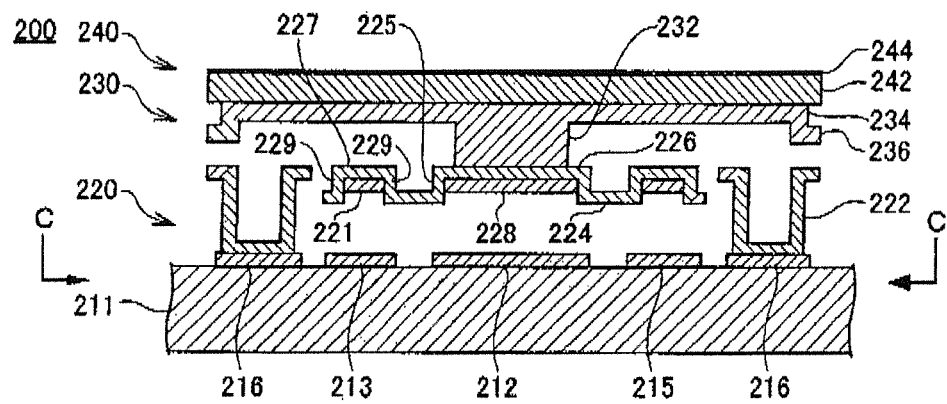
FIG. 40 is a cross-sectional view of the spatial light modulation element 200.

FIG. 40 is a schematic cross-sectional view of the spatial light modulation element 200. FIG. 40 shows the spatial light modulation element 200 in a state where the secured frame 222 is secured to the substrate 211, the flat portion 230 is secured to the reflecting portion 240, and the movable section 226 is secured, to the flat portion 230, sequentially, as seen in the cross-section at the line C-C shown in FIG. 39. Components that are the same as those in FIG. 39 are given the same reference numerals, and redundant descriptions are omitted.

As shown in FIG. 40, the movable frame 227 includes the electrode 221 on the bottom surface thereof. The electrode 221 is opposite the electrodes 213 and 215 of the substrate 211. Accordingly, when the drive voltage is applied to the electrodes 213 and 215, the right end or left end of the movable frame 227 in FIG. 40 is pulled toward the substrate 211.

The movable frame 227 includes ribs 229 that extend downward from the edges thereof. As a result, the movable frame 227 has high bend strength. On the other hand, the torsion shaft 224 does not include an element corresponding to the rib 225.

Accordingly, when a drive force acts on the movable section 226 due to the voltage applied to the electrodes 212 and 214, the torsion shaft 224 deforms elastically and the movable section 226 pivots toward the movable frame 227. Furthermore, the flat portion 230 and reflecting portion 240 supported by the movable section 226 also pivot.

The bottom end of the rib 229 includes a flange portion that expands in an outward direction and inward direction of the movable frame 227. This portion is a region remaining when the layer including the rib 229 is patterned, and does not need to be included.

However, the flange portion does not decrease the strength of the movable frame 227 and instead enhances the strength, and therefore may remain. As a result, the need for significantly increased patterning accuracy is avoided, and therefore the ability to be mass produced is improved.

Figure 41:
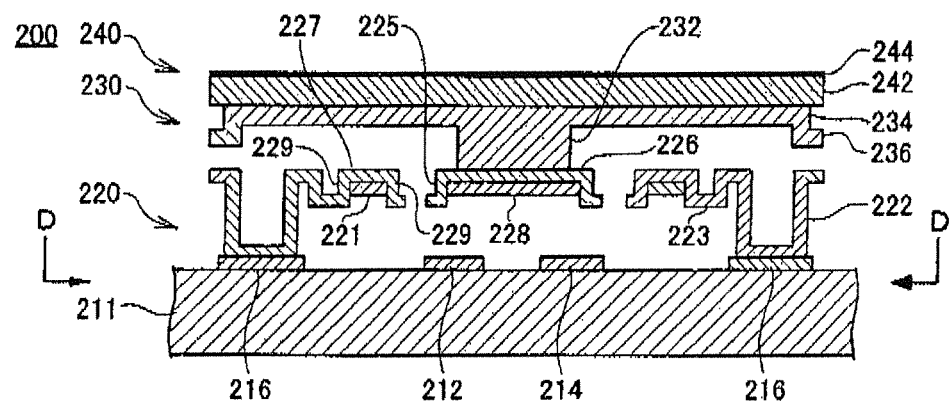
FIG. 41 is a cross-sectional view of the spatial light modulation element 200.

FIG. 41 is a schematic cross-sectional view of the spatial light modulation element 200, showing the D-D cross section of FIG. 39. Components that are the same as those in FIGS. 39 and 40 are given the same reference numerals, and redundant descriptions are omitted.

As shown in FIG. 41, the torsion shafts 223 connecting the secured frame 222 and the movable frame 227 do not include portions corresponding to the ribs 229. Accordingly, when the drive voltage is applied to one of the electrodes 213 and 215, the movable frame 227 pivots toward the substrate 211, with the torsion shafts 223 as the pivoting axis. Furthermore, the flat portion 230 and the reflecting portion 240 supported by the movable section 226 also pivot.

Figure 42:
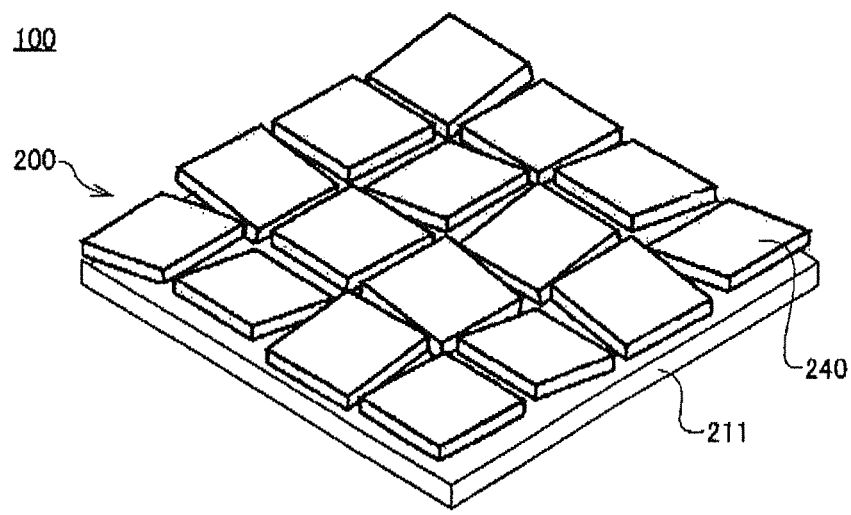
FIG. 42 is a perspective view of the spatial light modulator 100.

FIG. 42 is a schematic perspective view of the spatial light modulator 100. The spatial light modulator 100 includes a single substrate 211 and a plurality of reflecting portions 240 arranged on the substrate 211. The surfaces of the reflecting portion 240 form the reflective surface that reflects incident light.

The reflecting portions 240 are arranged on the substrate 211 in a matrix. Each reflecting portion 240 is a portion of a spatial light modulation element 200, and pivots independently relative to the substrate 211. As a result, the spatial light modulator 100 can form an intensity distribution for the reflected light.

Accordingly, by using the spatial light modulator 100 to reflect light from a light source having a uniform intensity distribution, for example, the propagation direction of the reflected light can be two-dimensionally changed to form an intensity pattern that is intentionally biased. Furthermore, light from a light source having a non-uniform intensity distribution can be reflected and changed by the spatial light modulator 100 to have a uniform distribution pattern. As a result, the degree of freedom for the drive pattern when forming the desired intensity pattern can be increased.

The spatial light modulator 100 described above can be manufactured as a micromachine using lithography techniques. Therefore, a spatial light modulator 100 with high resolution can be manufactured including hundreds to millions of miniature spatial light modulation elements 200. Such a spatial light modulator 100 can be used as a variable light source, an exposure apparatus, an image display apparatus, an optical switch, or the like.

The usage efficiency of the radiated light when the spatial light modulator 100 is used depends on the reflectance of the reflecting portion 240 of the spatial light modulation element 200, and therefore the reflecting portion 240 preferably has high reflectance. Furthermore, the lifetime of the spatial light modulator 100 can be increased by restricting the decrease in reflectance due to degradation of the reflecting portion 240 in the spatial light modulation element 200 after manufacturing.

Figure 43:
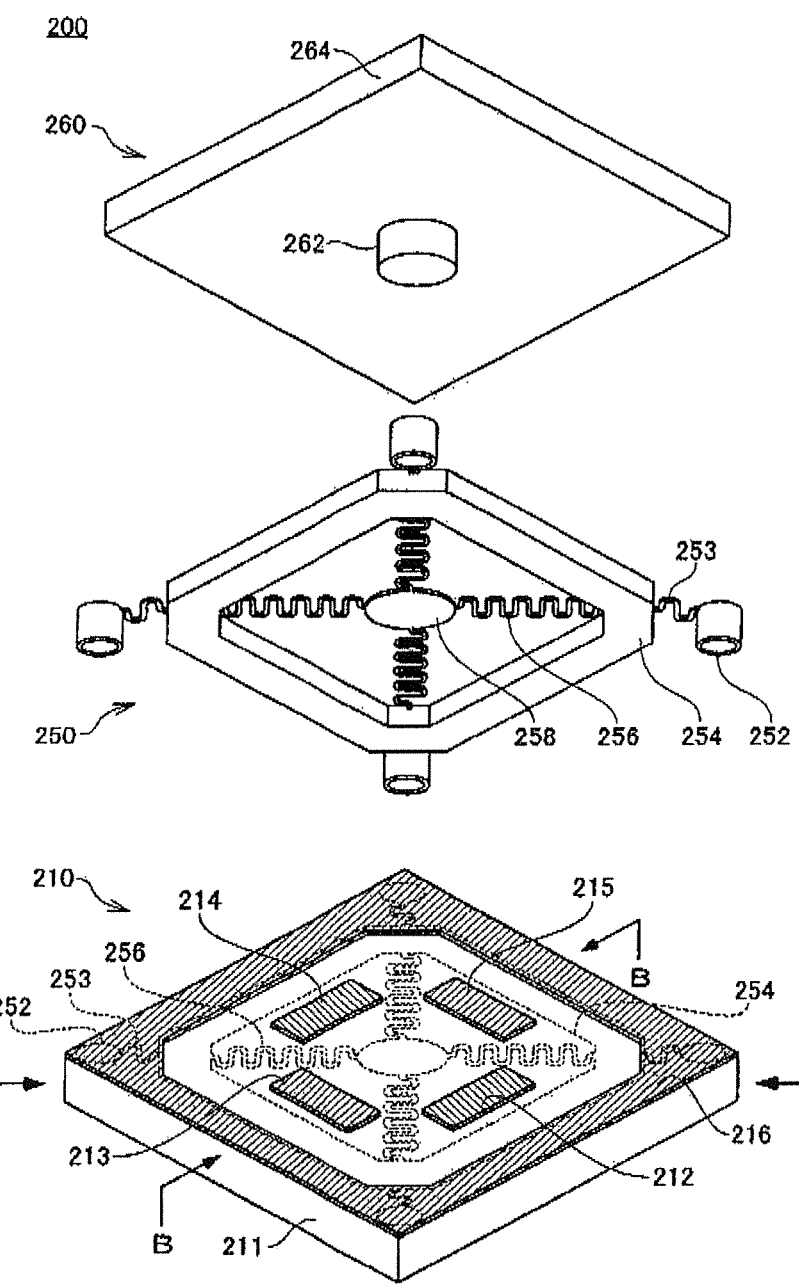
FIG. 43 is an exploded perspective view of the spatial light modulation element 200.

FIG. 43 is a schematic exploded perspective view of manufacturing of the spatial light modulation element 200 described above. The spatial light modulation element 200 includes the circuit portion 210, the support section 250, and the reflecting portion 260, which are layered sequentially.

The circuit portion 210 includes the substrate 211 and the electrodes 212, 213, 214, 215, and 216. The substrate 211 is a portion of the substrate 211 of the spatial light modulator 100 shown in FIG. 42, and has a CMOS circuit formed therein.

Some of the electrodes 212, 213, 214, and 215 are arranged as two pairs at positions opposite each other. These two pairs of electrodes 212, 213, 214, and 215 are supplied with a drive voltage from the CMOS circuit formed in the substrate 211. The other electrode 216 covers the entire edge portion of the substrate 211, and is connected to a reference voltage, e.g. a ground voltage.

Figure 44:
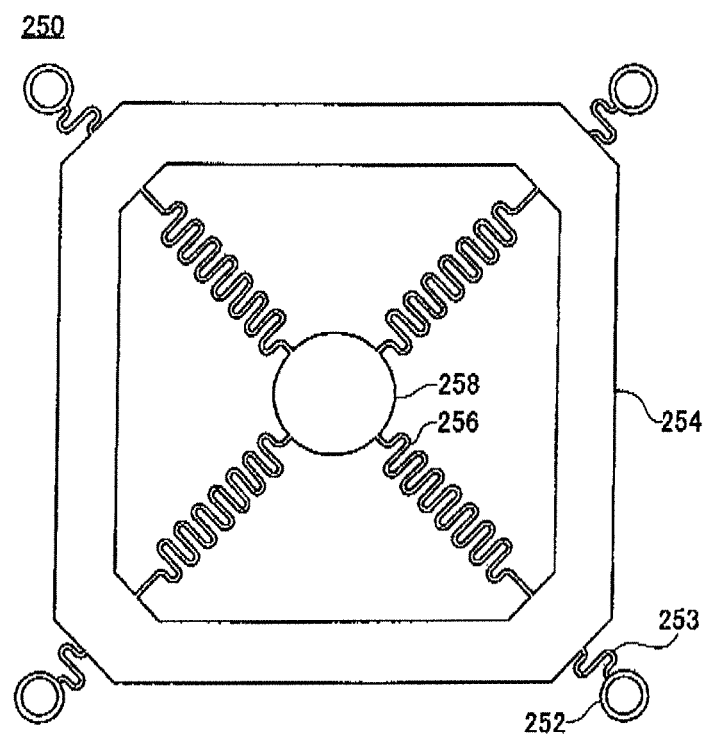
FIG. 44 is a planar view of the support section 250.

FIG. 44 is a planar view showing the shape of the support section 250 by itself. Components that are the same as those shown in FIG. 43 are given the same reference numerals, and redundant descriptions are omitted. The following description of the support section 250 references FIGS. 43 and 44 together.

The support section 250 includes lower posts 252, short flexures 253, a support frame 254, long flexures 256, and a pivoting board 258. The four lower posts 252 are secured to the four corners of the substrate 211 forming a single spatial light modulation element 200, and are upright relative to the surface of the substrate 211.

The support frame 254 has an overall rectangular shape, with four corners arranged near the lower posts 252. The corners of the support frame 254 are connected respectively to the top ends of the lower posts 252 by the short flexures 253 arranged outside the support frame 254.

The short flexures 253 are each formed as lines that repeatedly curve. As a result, the short flexures 253 have low elasticity and deform easily.

Two pairs of long flexures 256 are arranged within the support frame 254, and extend diagonally within the support frame 254. The long flexures 256 are also each formed as lines that repeatedly curve. Since the long flexures 256 are longer than the short flexures 253, the long flexures 256 deform more easily than the short flexures 253.

The pivoting board 258 is connected to the four corners of the support frame 254, by the long flexures 256. As a result, the pivoting board 258 is positioned at the substantial center of the substrate 211 in a state parallel to the substrate 211.

With reference to FIG. 43, the reflecting portion 260 includes an upper post 262 and a flat portion 264. The flat portion 264 includes a flat surface on the top side thereof in FIG. 43.

The upper post 262 protrudes downward in FIG. 43, from the center of the bottom surface of the flat portion 264. The bottom end surface of the upper post 262 has substantially the same shape as the pivoting board 258, and is connected to the pivoting board 258.

In FIG. 43, the shape and position of the support section 250 in the spatial light modulation element 200 is shown by the dotted lines on the surface of the circuit portion 210. Therefore, the positional relationship between the components of the support section 250 and the electrodes 212, 213, 214, and 215 can be seen. Specifically, the electrodes 212, 213, 214, and 215 on the substrate 211 and the long flexures 256 are arranged such that they do not overlap each other. As a result, the electrostatic force generated by the electrodes 212, 213, 214, and 215 acts efficiently on the flat portion 264.

Figure 45:
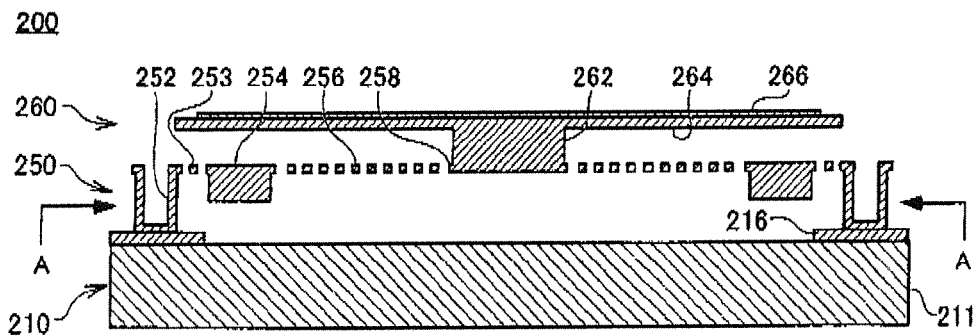
FIG. 45 is a cross-sectional view of the spatial light modulation element 200.

FIG. 45 is a schematic cross-sectional view of the spatial light modulation element 200. FIG. 45 shows a cross section indicated by the arrows A in FIG. 43. In FIG. 45, components that are the same as those shown in FIG. 43 are given the same reference numerals, and redundant descriptions are omitted.

The bottom end of each lower post 252 is secured to the electrode 216 of the substrate 211. The top end of the lower post 252 is connected to the support frame 254 via the short flexure 253. The height of the lower post 252 is greater than the thickness of the support frame 254, and therefore the support frame 254 is positioned parallel to the substrate 211, at a distance from the substrate 211.

Since the short flexure 253 deforms easily, when thermal expansion of the substrate 211 or the like occurs, this does not lead to displacement of the support frame 254. In this way, the short flexure 253 cuts off mechanical effects from the substrate 211 side including the lower post 252, and therefore stabilizes the temperature characteristics of the spatial light modulation element 200.

The support frame 254 has a greater thickness than the short flexure 253. Accordingly, the support frame 254 has relatively higher strength than the short flexure 253. Therefore, when thermal expansion of the substrate 211 or the like occurs and the lower post 252 is displaced, the support frame 254 is unlikely to deform.

The pivoting board 258 is connected to the support frame 254 via the long flexure 256. Since the long flexure 256 deforms easily, the pivoting board 258 can easily pivot relative to the substrate 211.

Since the pivoting board 258 has substantially the same thickness as the long flexure 256, the pivoting board 258 itself has low bend strength. However, when connected to the upper post 262, the pivoting board 258 barely deforms.

The bottom end of the upper post 262 of the reflecting portion 260 is connected integrally with the top surface of the pivoting board 258. As a result, the flat portion 264 of the reflecting portion 260 is supported horizontally above the support section 250. Furthermore, the reflecting portion 260 connected to the pivoting board 258 pivots together with the pivoting board 258 relative to the substrate 211.

The reflective film 266 is arranged on the top surface of the flat portion 264 of the reflecting portion 260 in FIG. 45. The reflective film 266 has a high reflectance for the incident light. When the reflecting portion 260 pivots, the reflective film 266 also pivots, and therefore the radiation direction of the reflected light changes according to the pivoting of the reflecting portion.

Figure 46:
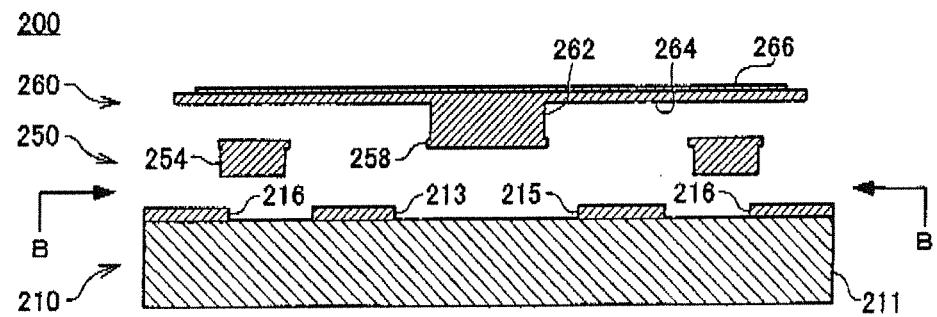
FIG. 46 is a cross-sectional view of the spatial light modulation element 200.

FIG. 46 is a schematic cross-sectional view of the spatial light modulation element 200. FIG. 46 shows the cross section indicated by the arrows B in FIG. 43. In FIG. 46, components that are the same as those shown in FIGS. 43, 44, and 45 are given the same reference numerals, and redundant descriptions are omitted.

In the cross section of FIG. 46, the support frame 254 and the pivoting board 258 are supported substantially parallel to the substrate 211, at a distance from the substrate 211. The electrodes 213 and 215 are arranged at positions symmetric to each other, with the center of the upper post 262 serving as the axis of symmetry. The electrodes 213 and 215 have the drive voltage applied thereto via the CMOS circuit of the circuit portion 210.

The electrodes 213 and 215 face the bottom surface of the flat portion 264. The flat portion 264 is electrically connected to a reference potential through the electrode 216, the support section 250, and the upper post 262. Accordingly, when the drive voltage is applied to the electrodes 213 and 215, an electrostatic force acts between the flat portion 264 and the electrodes 213 and 215.

Figure 47:
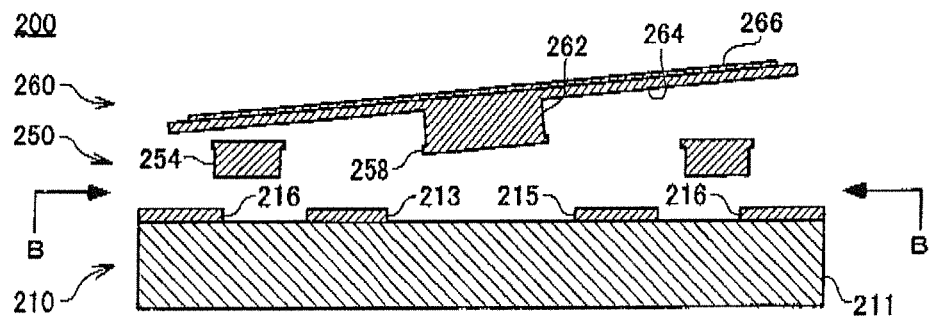
FIG. 47 is a cross-sectional view of the spatial light modulation element 200.

FIG. 47 is a cross sectional view of the spatial light modulation element 200, and shows the same cross section as FIG. 4-6. In FIG. 47, components that are the same as those shown in FIG. 46 are given the same reference numerals, and redundant descriptions are omitted.

In the spatial light modulation element 200, when a drive voltage with an inverted polarity is applied to the pair of electrodes 213 and 215, the electrostatic force causes the flat portion 264 to pivot and become inclined. As a result, the reflective film 266 is also inclined, and so the radiation direction of the light resulting from the incident light reflected by the reflective film 266 changes. The inclination of the flat portion 264 changes according to the magnitude of the drive voltage applied to the electrodes 213 and 215. In this way, the spatial light modulation element 200 can change the radiation direction of the reflected light by performing electrical control.

When the application of drive voltage to the electrodes 213 and 215 is stopped, the elasticity of the long flexure 256 causes the pivoting board 258 and the reflecting portion 260 to return to the state of being substantially parallel to the substrate 211. Accordingly, when the drive voltage is removed, the reflective characteristics of the spatial light modulation element 200 return to the initial state.

Figure 48:
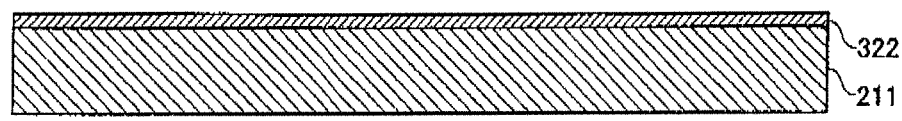
FIG. 48 is a cross-sectional view of the process for manufacturing the spatial light modulation element 200.
Figure 49:
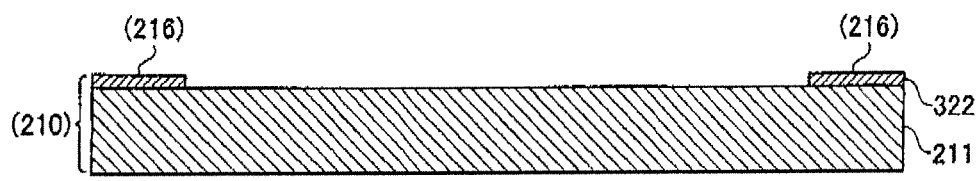
FIG. 49 is a cross-sectional view of a step following the step of FIG. 48 in the process for manufacturing the spatial light modulation element 200.
Figure 60:
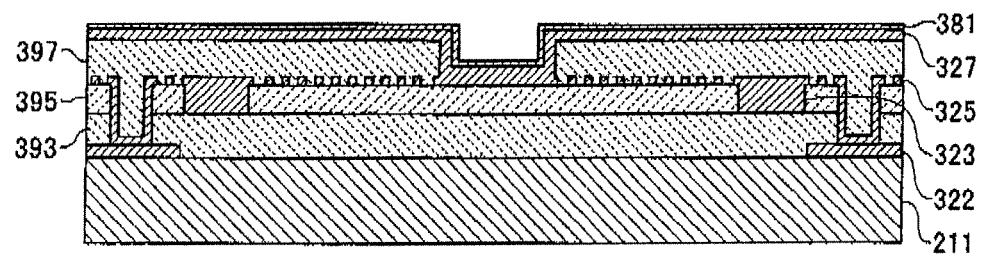
FIG. 60 is a cross-sectional view of a step following the step of FIG. 59 in the process for manufacturing the spatial light modulation element 200.
Figure 61:
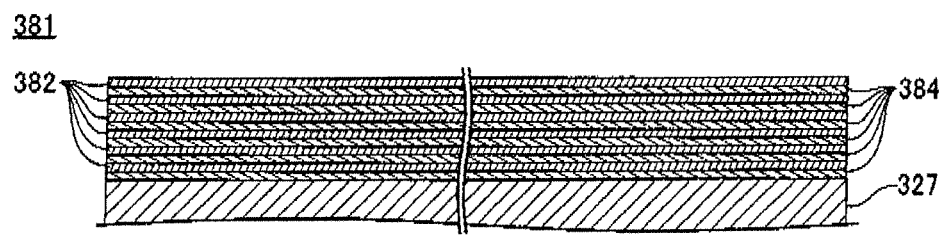
FIG. 61 is a cross-sectional schematic view of the dielectric multilayer film 381.

FIGS. 48 to 67, excluding FIG. 61, are each a cross-sectional view of the same cross section as shown in FIG. 45, during a step in the process for manufacturing the spatial light modulation element 200. FIGS. 48 and 49 show a portion of the process for manufacturing the circuit portion 210. FIGS. 50 to 56 show a process for manufacturing the support section 250, and FIGS. 57 to 62 show a process for manufacturing the reflecting portion 260. FIG. 63 and onward show a process relating to protection of the reflective film 266.

There are cases where corresponding components in the spatial light modulation element 200 will have different shapes or states during the manufacturing process than in the completed spatial light modulation element 200. Therefore, in the following description, a unique reference numeral is given to each component during manufacturing, and when a portion or all of a component is completed, the relationship of this component to the components of the spatial light modulation element 200 is explained.

First, as shown in FIG. 48, the substrate 211 on which the spatial light modulation element 200 is to be performed is prepared, and the conductive layer 322 that will become the electrodes 212, 213, 214, 215, and 216 is deposited over the entire surface of the substrate 211. The substrate 211 can be a silicon monocrystalline substrate, or can be another widely used component having a flat surface, such as a compound semiconductor substrate or a ceramic substrate. A CMOS circuit, wiring providing drive power, and the like are formed in advance in the substrate 211.

The conductive layer 322 can be formed by a common conductive material such as Al or Cu, or by a metal such as an alloy including primarily Ti, an alloy including primarily Al, or an alloy including primarily Cu. The method for depositing the conductive layer 322 can be selected from among any type of physical vapor deposition, chemical vapor deposition, gold impregnation, or the like, depending on the material for the conductive layer 322.

Next, as shown in FIG. 49, the conductive layer 322 is patterned. As a result, the electrode 216 is formed on the spatial light modulation element 200. Although not shown in the cross section of FIG. 49, the other electrodes 212, 213, 214, and 215 are formed at the same time.

The surface of the conductive layer 322 patterned as the electrodes 212, 214, and 216 may be covered with an insulating thin film. In this way, the resistance to short circuits between the electrodes 212, 213, 214, and 215 can be improved.

An oxide or nitride of the material of the substrate 211 can be used as the material for the insulating layer, for example. Furthermore, the insulating layer may be a porous body with a high dielectric constant. The method for depositing the insulating material layer can be selected from among any type of physical vapor deposition or chemical vapor deposition, depending on the material for the insulating layer.

Figure 50:
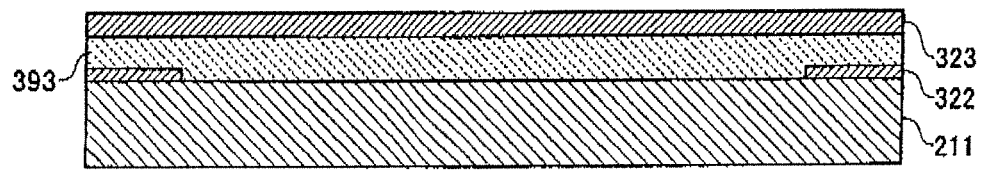
FIG. 50 is a cross-sectional view of a step following the step of FIG. 49 in the process for manufacturing the spatial light modulation element 200.

Next, as shown in FIG. 50, the substrate 211 and the conductive layer 322 are covered by the sacrificial layer 393, and a flat deposition base is formed above the surface of the substrate 211 and the conductive layer 322. The sacrificial layer 393 can form the flat deposition base by using silicon oxide, for example. The deposition method of the sacrificial layer 393 can be selected from among any type of physical vapor deposition, chemical vapor deposition, gold impregnation, or the like.

Next, the metal layer 323 is deposited on the surface of the deposition base formed by the sacrificial layer 393. The material of the metal layer 323 can be an alloy including primarily Ti or an alloy including primarily AL, for example, and can be formed using any type of physical vapor deposition, chemical vapor deposition, gold impregnation, or the like.

Figure 51:
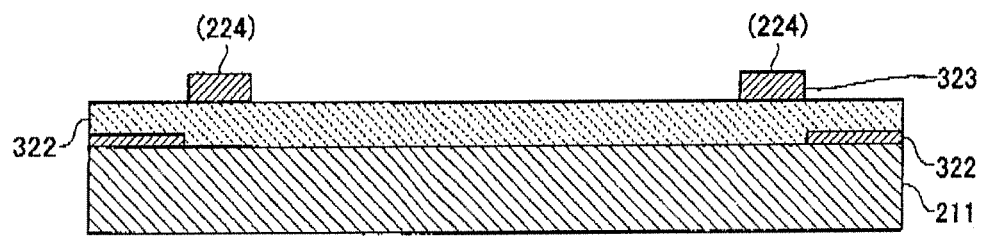
FIG. 51 is a cross-sectional view of a step following the step of FIG. 50 in the process for manufacturing the spatial light modulation element 200.

Next, as shown in FIG. 51, the metal layer 323 is patterned by using dry etching or the like. In this way, the metal pattern serving as a portion of the support frame 254 in the spatial light modulation element 200 is formed.

Figure 52:
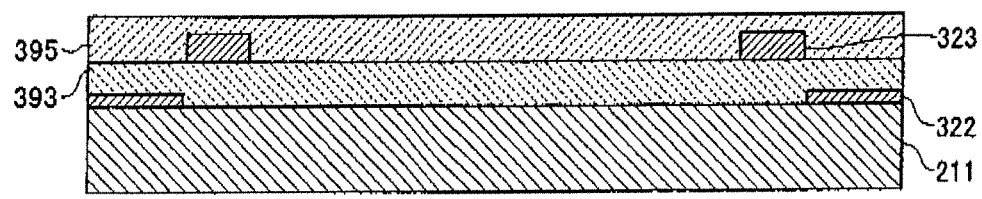
FIG. 52 is a cross-sectional view of a step following the step of FIG. 51 in the process for manufacturing the spatial light modulation element 200.

Next, the portions other than the support frame 254 of the support section 250 in the spatial light modulation element 200 are formed. First, as shown in FIG. 52, a new sacrificial layer 395 is deposited on over the entire surface of the sacrificial layer 393 and the metal layer 323. As a result, the metal layer 323 is buried in the sacrificial layer 395. The material and deposition method used for the sacrificial layer 395 may be the same as used for the initial sacrificial layer 393, or may be different.

Figure 53:
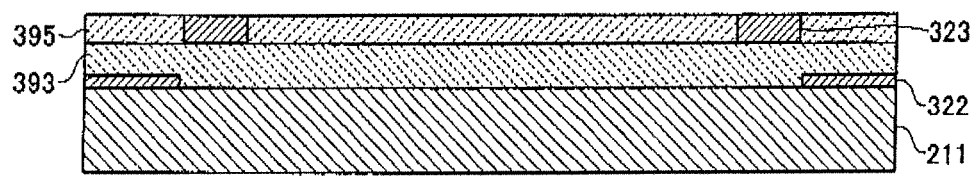
FIG. 53 is a cross-sectional view of a step following the step of FIG. 52 in the process for manufacturing the spatial light modulation element 200.

Next, as shown in FIG. 53, the height of the surface of the sacrificial layer 395 is adjusted, such that the surface of the sacrificial layer 395 and the surface of the metal layer 323 form a single continuous surface. The height of the surface of the sacrificial layer 395 can be adjusted by removing a portion of the surface of the sacrificial layer 395 in the height direction using an HF vapor technique, for example.

Figure 54:
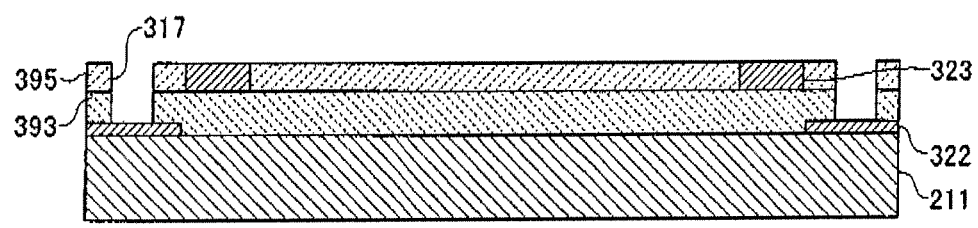
FIG. 54 is a cross-sectional view of a step following the step of FIG. 53 in the process for manufacturing the spatial light modulation element 200.

Next, as shown in FIG. 54, the two sacrificial layers 393 and 395 are patterned together, thereby forming a contact hole 317 that reaches the conductive layer 322. The contact hole 317 can be formed by dry etching, for example. In this way, the deposition base having a stereoscopic shape is formed on the substrate 211.

Figure 55:
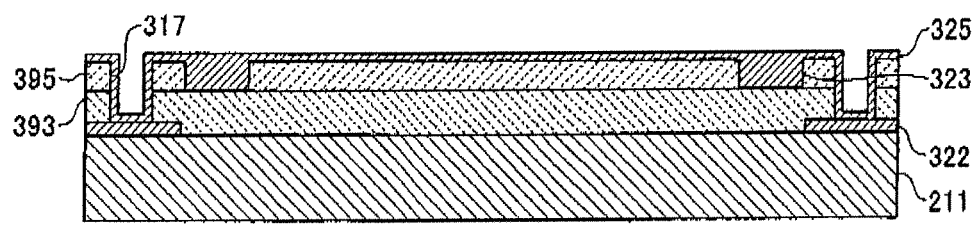
FIG. 55 is a cross-sectional view of a step following the step of FIG. 54 in the process for manufacturing the spatial light modulation element 200.

Next, as shown in FIG. 55, a new metal layer 325 is deposited on the entire surface of the exposed conductive layer 322, sacrificial layer 395, and metal layer 323. As a result, a portion of the metal layer 325 is formed integrally with the metal layer 323.

In this way, the integrated metal layer including regions with different thickness is formed. The metal layer 325 can be formed by a material that is the same as or at least has a good affinity with the material of the metal layer 323 serving as a portion of the base, and such material includes an alloy including primarily Ti and an alloy including primarily Al, for example. The deposition method can be selected from among physical vapor deposition, chemical vapor deposition, gold impregnation, or the like.

Figure 56:
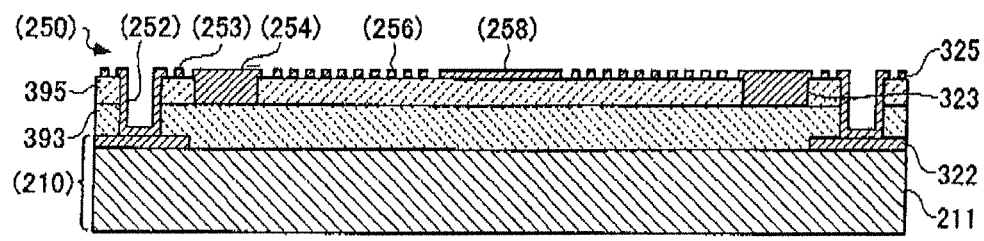
FIG. 56 is a cross-sectional view of a step following the step of FIG. 55 in the process for manufacturing the spatial light modulation element 200.

Next, as shown in FIG. 56, the metal layer 325 is patterned using dry etching, for example. In this way, the elements of the support section 250 in the spatial light modulation element 200 are formed. Specifically, the lower posts 252, the short flexures 253, the support frame 254, the long flexures 256, and the pivoting board 258 are formed by the metal layers 323 and 325, as shown in the reference numerals in parentheses in FIG. 56.

Since the metal layer 325 and the bottom layer of the metal layer 323 are formed integrally, the support frame 254 is thicker than the short flexure 253, the long flexure 256, and the pivoting board 258, and therefor has high strength. In this way, by using the two sacrificial layers 393 and 395 as the deposition base, a stereoscopic structure can be formed using lithography techniques.

Figure 57:
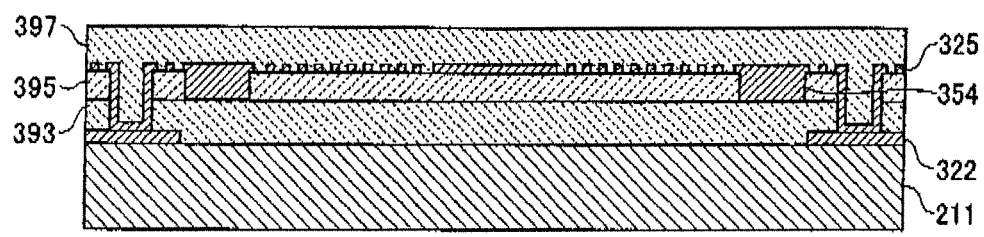
FIG. 57 is a cross-sectional view of a step following the step of FIG. 56 in the process for manufacturing the spatial light modulation element 200.

Next, as shown in FIG. 57, a new sacrificial layer 397 is deposited. As a result, the surfaces of the metal layer 325 and the sacrificial layer 395 are buried by the sacrificial layer 397. The material and deposition method used for the sacrificial layer 395 may be the same as used for the initial sacrificial layer 393, or may be different.

Figure 58:
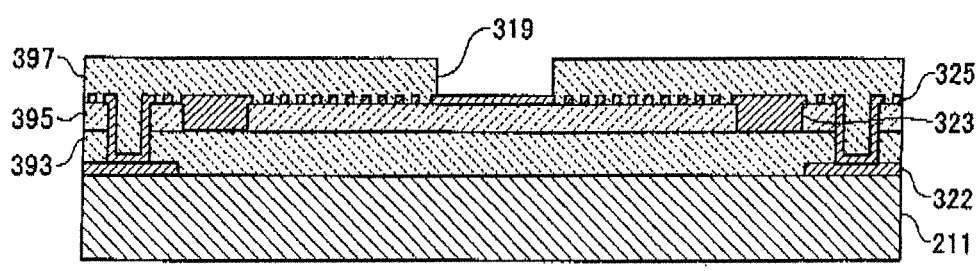
FIG. 58 is a cross-sectional view of a step following the step of FIG. 57 in the process for manufacturing the spatial light modulation element 200.

Furthermore, as shown in FIG. 58, the sacrificial layer 397 is patterned to form the contact hole 319. The contact hole 319 reaches the surface of the pivoting board 258 formed by the metal layer 325. The contact hole 319 can be formed by dry etching, for example. In this way, the deposition base having a stereoscopic shape is again formed on the topmost surface of the substrate 211.

Figure 59:
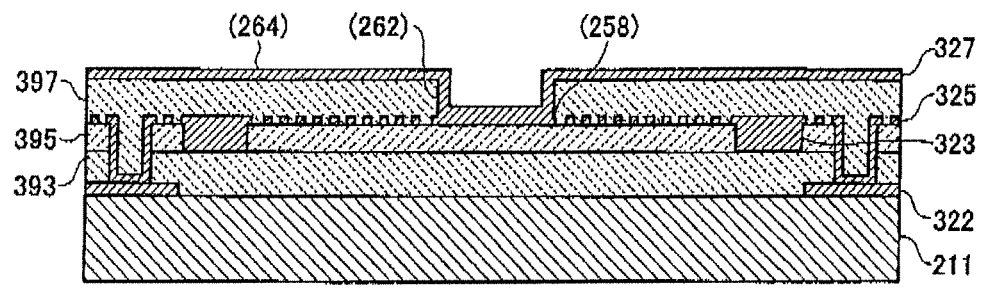
FIG. 59 is a cross-sectional view of a step following the step of FIG. 58 in the process for manufacturing the spatial light modulation element 200.

Next, as shown in FIG. 59, a new metal layer 327 is deposited over the entire surface of the sacrificial layer 397 and the metal layer 325. The metal layer 327 can be formed by an alloy including primarily Ti or an alloy including primarily Al, for example. The deposition method can be selected from among physical vapor deposition, chemical vapor deposition, gold impregnation, or the like.

The portion of the metal layer 327 formed in this manner adjacent to the pivoting board 258 where the metal layer 325 is formed serves as the upper post 262 of the reflecting portion 260. In the metal layer 327, the portion that is deposited on the top surface of the sacrificial layer 397 becomes the flat portion 264 of the reflecting portion 260.

In the above example, the upper post 262 and the flat portion 264 are formed at once, by the metal layer 327. Therefore, a sunken portion occurs in the center of the flat portion 264. In order to avoid such a sunken portion, the flat portion 264 may be formed again after burying the sunken portion with another sacrificial layer. In this way, the flat portion 264 can be formed to be entirely flat.

Next, as shown in FIG. 60, the dielectric multilayer film 381 is deposited on the surface of the metal layer 327. The dielectric multilayer film 381 becomes the reflective film 266 of the spatial light modulation element 200.

FIG. 61 is a schematic cross-sectional view of the structure of the dielectric multilayer film 381. The dielectric multilayer film 381 is formed by alternately layering two types of dielectric thin films having different refractive indexes, e.g. an $Al_2O_3$ thin film 382 and a $SiO_2$ thin film 384.

A set of the $Al_2O_3$ thin film 382 and the $SiO_2$ thin film 384 are layered. The $Al_2O_3$ thin film 382 and the $SiO_2$ thin film 384 may each have a thickness from tens to hundreds of millimeters, and the number of layers of this set may be ten or more. The deposition method for the dielectric multilayer film 381 can be ion beam sputtering, for example, but is not limited to this method.

Due to the combination of materials, a chemical reaction, scattering, or the like can occur between the lowest layer of the dielectric multilayer film 381 and the metal layer 327. In such a case, before depositing the dielectric multilayer film 381 on the metal layer 327, a barrier layer is preferably provided on the surface of the metal layer 327 and the dielectric multilayer film 381 is then preferably deposited on the surface of this barrier layer.

The flatness of the dielectric multilayer film 381 affects its reflectance as the reflective film 266. Furthermore, the flatness of the dielectric multilayer film 381 is affected by the flatness of the metal layer 327 serving as the base. Accordingly, prior to forming the dielectric multilayer film 381, the surface of the metal layer 327 may be processed to be flat, through polishing or the like.

Furthermore, there are cases where residual stress occurs in the dielectric multilayer film 381 formed on the surface of the metal layer 327. Accordingly, the residual stress may be reduced by heating after the dielectric multilayer film 381 is deposited, for example. As a result, the flatness of the reflective film 266 is stabilized, and therefore the reflection efficiency can be improved.

Figure 62:
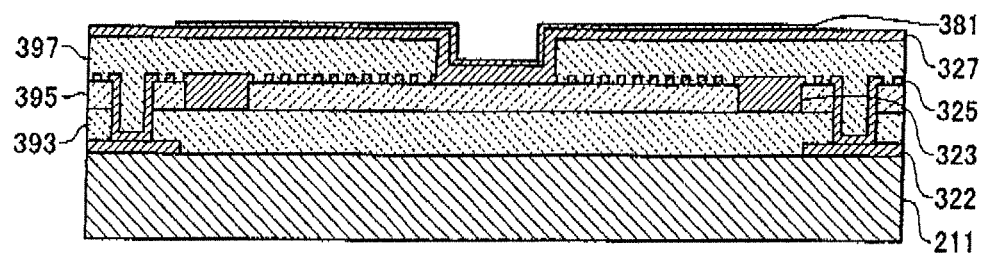
FIG. 62 is a cross-sectional view of a step following the step of FIG. 60 in the process for manufacturing the spatial light modulation element 200.
Figure 63:
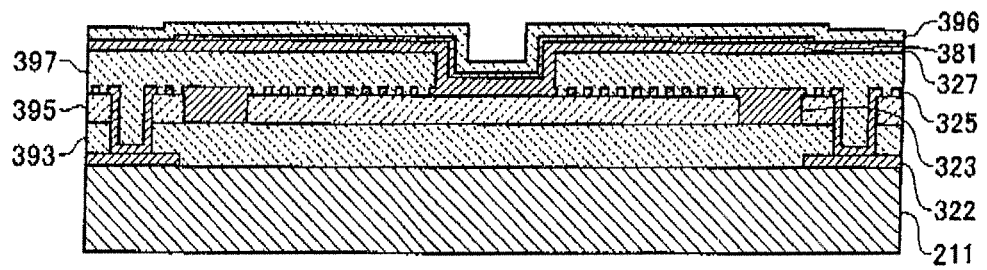
FIG. 63 is a cross-sectional view of a step following the step of FIG. 62 in the process for manufacturing the spatial light modulation element 200.

Next, as shown in FIG. 62, the edges of the dielectric multilayer film 381 are trimmed. As a result, a portion of the metal layer 327 is exposed. The dielectric multilayer film 381 can be trimmed using dry etching or the like.

Next, as shown in FIG. 63, the sacrificial protective layer 396 is deposited on the surface of the dielectric multilayer film 381 and the surface of the metal layer 327 exposed around the dielectric multilayer film 381. As a result of the trimming described above, the metal layer 327 extends outward beyond the dielectric multilayer film 381, and therefore the sacrificial protective layer 396 covers the top surface and side surfaces of the dielectric multilayer film 381 without gaps.

The material for the sacrificial protective layer 396 can be selected as desired, as long as the material is resistant to the etchant that is used when removing the sacrificial layers 393, 395, and 397 formed in the bottom layer of the metal layer 327. It should be noted that the material of the sacrificial protective layer 396 is preferably chemically stable with respect to the dielectric multilayer film 381.

Examples of such material include an organic film for nano-implantation or a positive resist. If a resist is used as the sacrificial protective layer 396, the resist can be applied using spin coating.

Figure 64:
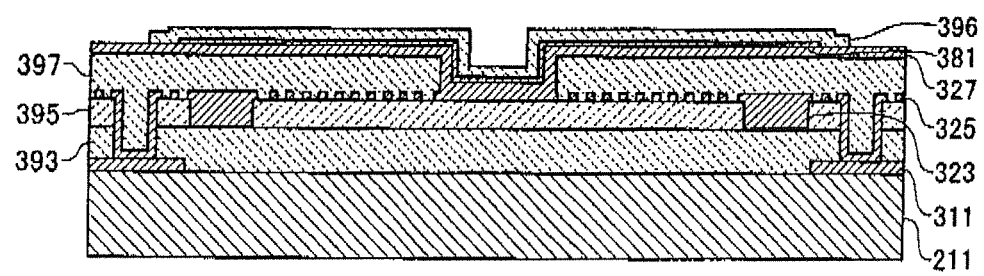
FIG. 64 is a cross-sectional view of a step following the step of FIG. 63 in the process for manufacturing the spatial light modulation element 200.

Next, as shown in FIG. 64, the edge portion of the sacrificial protective layer 396 is trimmed. The sacrificial protective layer 396 can be trimmed using dry etching, for example. As a result, a portion of the metal layer 327 around the sacrificial protective layer 396 is exposed.

When trimming the sacrificial protective layer 396, the remaining region of the sacrificial protective layer 396 is preferably wider than the dielectric multilayer film 381. As a result, the sacrificial protective layer 396 can protect the side surfaces of the dielectric multilayer film 381.

Figure 65:
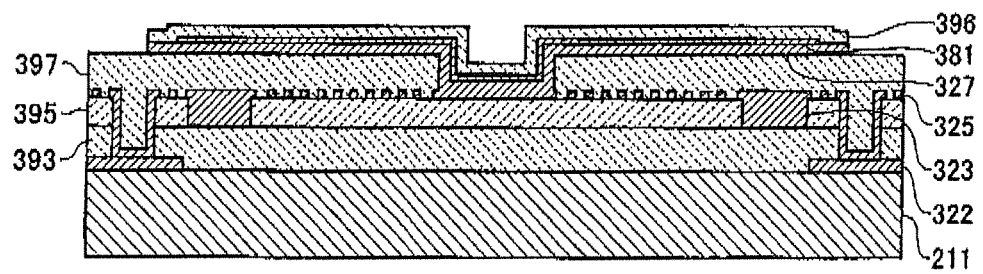
FIG. 65 is a cross-sectional view of a step following the step of FIG. 64 in the process for manufacturing the spatial light modulation element 200.

Next, as shown in FIG. 65, the sacrificial protective layer 396 is used as a mask and the metal layer 327 is patterned. The metal layer 327 can be patterned using dry etching, for example. In this way, the top surface of the sacrificial layer 397 is exposed in the region outside the metal layer 327 and the sacrificial protective layer 396. The surface of the dielectric multilayer film 381, including the side surfaces thereof, is completely covered by the metal layer 327 or sacrificial protective layer 396.

When considering the exposure of the sacrificial layer 397, it is sufficient to simply remove a portion of the metal layer 327, but when a plurality of spatial light modulation elements 200 are formed en bloc on a single substrate 211, the metal layers 327 of adjacent spatial light modulation elements 200 are severed at this stage. As a result, the independent flat portions 264 are formed on each of the spatial light modulation elements 200.

Figure 66:
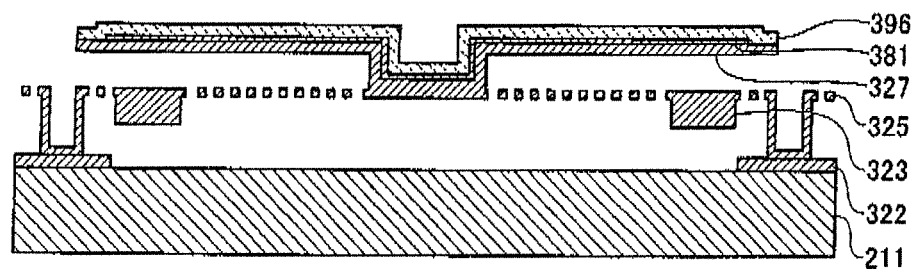
FIG. 66 is a cross-sectional view of a step following the step of FIG. 65 in the process for manufacturing the spatial light modulation element 200.

Next, as shown in FIG. 66, the sacrificial layers 393, 395, and 397 are removed. The three sacrificial layers 393, 395, and 397 are continuous with each other, and therefore can be removed all together through the HF vapor technique using a gas etchant.

At this stage, the dielectric multilayer film 381 is covered by the sacrificial protective layer 396, and is therefore not contacted by the etchant. The sacrificial protective layer 396 has high resistance with respect to the etchant, such as HF vapor, and therefore can protect the dielectric multilayer film 381 from the etchant.

Figure 67:
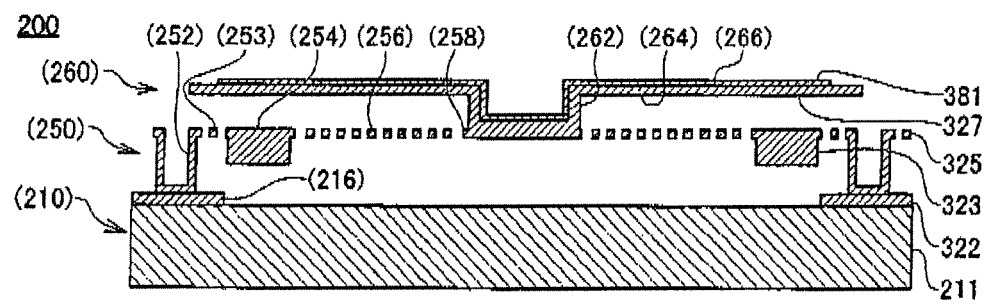
FIG. 67 is a cross-sectional view of a step following the step of FIG. 66 in the process for manufacturing the spatial light modulation element 200.

Next, as shown in FIG. 67, the sacrificial protective layer 396 is removed. The sacrificial protective layer 396 can be removed without affecting the dielectric multilayer film 381, by performing dry etching using oxygen plasma, for example. In this way, the spatial light modulation element 200 is completed and includes the reflective film 266 formed by the dielectric multilayer film 381 having high reflectance.

In the manufacturing process described above, the degradation of the dielectric multilayer film 381 caused by the etchant used when removing the sacrificial layers 393, 395, and 397 can be prevented by protecting the sacrificial protective layer 396. Accordingly, by forming a plurality of the spatial light modulation elements 200 en bloc on a single substrate 211, a spatial light modulator 100 with high reflectance can be manufactured.

By removing the sacrificial protective layer 396 that protects the dielectric multilayer film 381, the etchant component remaining in the surface of the sacrificial protective layer 396 can be completely removed. As a result, the degradation over time of the reflection efficiency of the spatial light modulation element 200 can be restricted.

In the above example, the sacrificial protective layer 396 is trimmed at the stage shown in FIG. 64, and then the metal layer 327 is patterned at the step shown in FIG. 65. However, if any processes harmful to the dielectric multilayer film 381 are avoided, the sacrificial protective layer 396 may be formed after the metal layer 327 is patterned, and the sacrificial protective layer 396 may then be patterned. In either case, the dielectric multilayer film 381 is preferably protected from the etchant by removing the sacrificial layers 393, 395, and 397 below the sacrificial protective layer 396.

Figure 68:
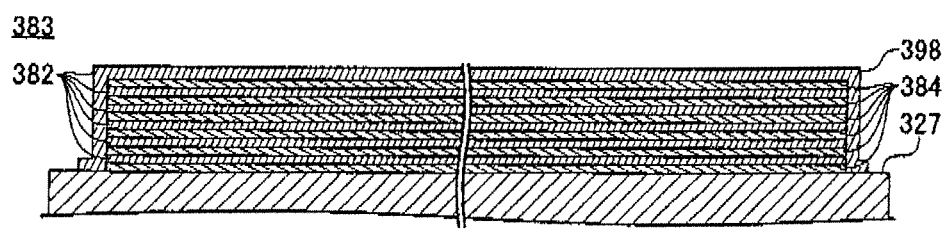
FIG. 68 is a cross-sectional schematic view of the dielectric multilayer film 383.

FIG. 68 is a cross-sectional view of a dielectric multilayer film 383 having a different structure than described above. The dielectric multilayer film 383 is formed on the surface of the metal layer 327 at the stage shown in FIG. 60.

The dielectric multilayer film 383 shown in FIG. 68 is formed by alternately depositing two or more types of dielectric thin films with different refractive indexes horizontally on each other, e.g. an $Al_2O_3$ thin film 382 and a $SiO_2$ thin film 384. Furthermore, the $Al_2O_3$ thin film 382 on the topmost layer of the dielectric multilayer film 383 wraps around the side surface of the dielectric multilayer film 383 and continues to the surface of the metal layer 327.

Among the $Al_2O_3$ thin films 382 and $SiO_2$ thin films 384 forming the dielectric multilayer film 383, the $Al_2O_3$ thin films 382 are chemically resistant to the etchant, such as HF vapor, that is used when removing the sacrificial layers 393, 395, and 397. Accordingly, the dielectric multilayer film 383 having the structure described above, can use the $Al_2O_3$ thin films 382 thereof as a permanent protective layer 398. By depositing the $Al_2O_3$ thin films 382 using sputtering or chemical vapor deposition, for example, the permanent protective layer 398 can be formed continuously from the surface of the dielectric multilayer film 383 to the side surfaces.

As a result, the steps of forming, patterning, and removing the sacrificial protective layer 396 shown in FIGS. 63 to 66 can be omitted. Furthermore, since the permanent protective layer 398 is formed of the same material as a portion of the dielectric multilayer film 381, deposition can continue using the deposition environment of the dielectric multilayer film 381. Accordingly, the manufacturing process of the spatial light modulation element 200 can be simplified.

The permanent protective layer 398 formed by the Al$_2$O$_3$ thin film 382 can be used permanently as the protective layer of the dielectric multilayer film 381, after the spatial light modulation element 200 is completed. As a result, the degradation over time of the characteristics of the spatial light modulation element 200 can be restricted, and the lifetime thereof can be increased.

The Al$_2$O$_3$ thin film 382 serving as the permanent protective layer 398 is preferably thicker than the other Al$_2$O$_3$ thin films 382. As a result, the performance of this Al$_2$O$_3$ thin film 382 as the permanent protective layer 398 can be improved.

The permanent protective layer 398 remains on the surface of the dielectric multilayer film 381 even after the spatial light modulation element 200 is completed, and is transparent to both the radiation light and the reflected light. Accordingly, in order to avoid any optical effect on the radiation light or reflected light, the permanent protective layer 398 preferably has a thickness that is an integer multiple of a half-wavelength with respect to the wavelength of the incident light reflected by the dielectric multilayer film 381.

Figure 69:
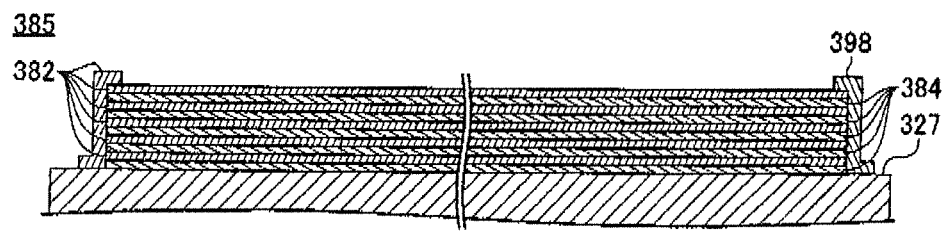
FIG. 69 is a cross-sectional schematic view of the dielectric multilayer film 385.

FIG. 69 is a cross-sectional view of another dielectric multilayer film 385. The dielectric multilayer film 385 is formed on the surface of the metal layer 327 at the stage shown in FIG. 60.

The dielectric multilayer film 385 shown in FIG. 69 is formed by alternately depositing two or more types of dielectric thin films with different refractive indexes horizontally on each other, e.g. an Al$_2$O$_3$ thin film 382 and a SiO$_2$ thin film 384. It should be noted that the topmost layer in the dielectric multilayer film 385 is formed by an Al$_2$O$_3$ thin film 382 that is resistant to the etchant used for the sacrificial layers 393, 395, and 397.

The dielectric multilayer film 385 further includes a permanent protective layer 398 that covers the side surface of the dielectric multilayer film 383 continuously from the top thereof to the surface of the metal layer 327. In this way, the SiO$_2$ thin films 384, which are not resistant to the etchant used for the sacrificial layers 393, 395, and 397, can be isolated from the outside.

Accordingly, in the same manner as the dielectric multilayer film 383 shown in FIG. 68, the sacrificial layers 393, 395, and 397 can be removed without using the sacrificial protective layer 396. Furthermore, the permanent protective layer 398 can be formed in series in the deposition environment of the dielectric multilayer film 381. Yet further, the dielectric multilayer film 381 can continue protecting the spatial light modulation element 200 after manufacturing is completed.

The permanent protective layer 398 formed on the side surfaces of the dielectric multilayer film 381 does not affect the characteristics of the dielectric multilayer film 381 as a reflective film 266. Accordingly, the thickness and shape of the permanent protective layer 398 can be selected freely.

Figure 70:
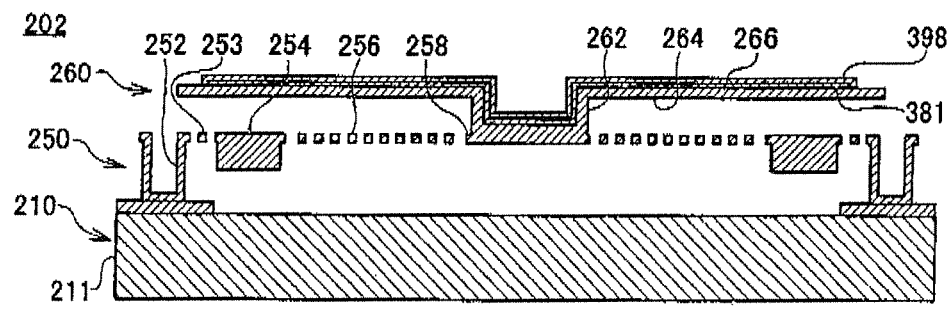
FIG. 70 is a cross-sectional view of the spatial light modulation element 202.

FIG. 70 is a cross-sectional view of the spatial light modulation element 202. The spatial light modulation element 202 has the same configuration as the spatial light modulation element 200 shown in FIG. 67, except that the spatial light modulation element 202 includes a permanent protective layer 398 covering the surface of the reflective film 266 formed by the dielectric multilayer film 381. Components that are the same as those of the spatial light modulation element 200 shown in FIG. 67 are given the same reference numerals, and redundant descriptions are omitted.

When manufacturing the spatial light modulation element 200, the permanent protective layer 398 is formed again after the sacrificial protective layer 396 is removed. As a result, as described above, the etchant component remaining on the surface of the sacrificial protective layer 396 when removing the sacrificial layers 393, 395, and 397 can be removed. Furthermore, by providing the permanent protective layer 398, the dielectric multilayer film 381 is permanently protected from oxygen or the like in the atmosphere, and the lifetime of the spatial light modulation element 202 can be extended.

The above describes a process for manufacturing a single spatial light modulation element 200. However, a spatial light modulator 100 can be formed by manufacturing a plurality of spatial light modulation elements 200 en bloc on a single substrate 211. Furthermore, a plurality of spatial light modulators 100 that each include a plurality of spatial light modulation elements 200 can be manufactured by using a large substrate 211.

Figure 71:
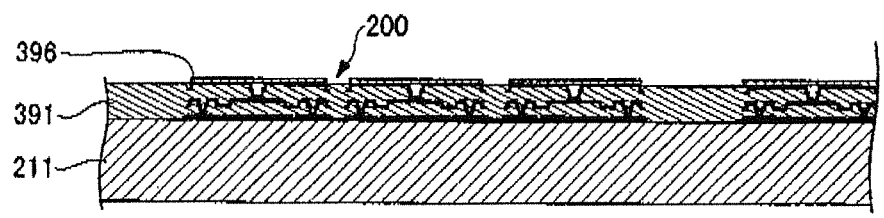
FIG. 71 is a cross-sectional view of a step in the process for manufacturing the spatial light modulator 100.
Figure 72:
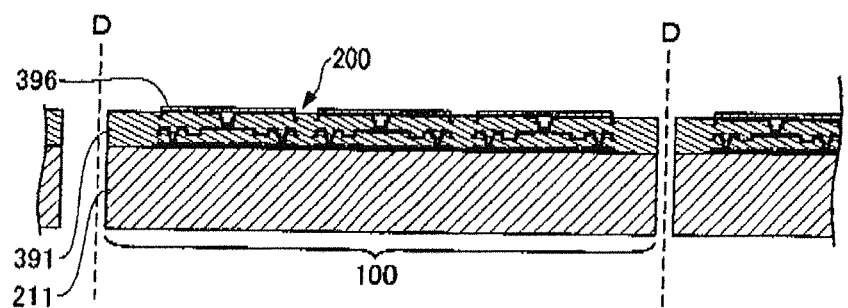
FIG. 72 is a cross-sectional view of a step following the step of FIG. 70 in the process for manufacturing the spatial light modulator 100.
Figure 73:
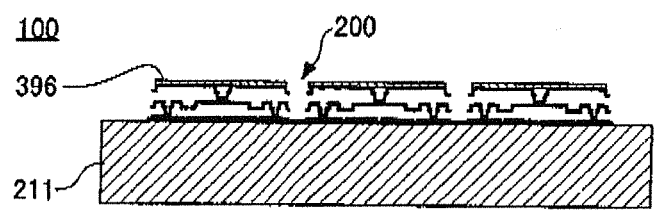
FIG. 73 is a cross-sectional view of the spatial light modulator 100.

FIGS. 71 to 73 are each a schematic view of a portion of the process for manufacturing a plurality of the spatial light modulators 100. Components that are the same as those shown in FIGS. 1 to 70 are given the same reference numerals, and redundant descriptions are omitted. In FIGS. 71 to 73, the sacrificial layer 391 represents the set of the three sacrificial layers 393, 395, and 397 shown in FIGS. 1 to 65.

In the state shown in FIG. 71, the machining for the spatial light modulation elements 200 including patterning of the metal layer 327 is already completed, in the same manner as in the state shown in FIG. 65. However, the portion of the spatial light modulation element 200 below the flat portion 264 is buried by the sacrificial layer 391. Furthermore, the surfaces of the metal layer 327 and dielectric multilayer film 381 are covered by the sacrificial protective layer 396.

As described above, a spatial light modulation element 200 on the substrate 211 is completed by removing the sacrificial layer 391 below the sacrificial protective layer 396. However, when the sacrificial layer 391 is removed, the reflecting portion 260 of the spatial light modulation element 200 pivots easily.

Therefore, as shown by the dotted lines D in FIG. 72, the dicing of the substrate 211 is performed with the sacrificial layer 391 and the sacrificial protective layer 396 still present. As a result, the reflecting portion 260, support section 250, and the like of the spatial light modulation element 200 can be protected from mechanical loads caused by vibration occurring during dicing and transport.

Since the sacrificial protective layer 396 remains in the spatial light modulator 100 being diced and divided, as shown in FIG. 73, even when the sacrificial layer 391 is removed using HF vapor or the like, the dielectric multilayer film 381 is not degraded. In this way, the manufacturing yield of the spatial light modulator 100 can be improved.

In the above example, in the spatial light modulation element 200, the structures other than the dielectric multilayer film 381 are formed primarily using metal material. However, the material of the spatial light modulation element 200 is not limited to metal material, and the spatial light modulation element 200 can use oxides, nitrides, carbides, or the like of the material forming the substrate 211, for example. Furthermore, each layer can be formed as a laminated structure using a plurality of materials, in order to make the components lightweight, for example.

In the spatial light modulation element 200 described above, the thickness T of each dielectric thin film forming the dielectric film 380 is preferably within a range that includes the values shown by the expression below, for the wavelength λ of the incident light, the refractive index n of the dielectric thin film, and the incident angle θ of the incident light.

$$T=\lambda/(4n\cos\theta)[nm]$$

For example, if the wavelength of the incident light is 193 nm, the high refractive index layer in the dielectric film 380 is formed of $Al_2O_3$, and the low refractive index layer is formed of $SiO_2$, then it is preferable that the thickness of the high refractive index $Al_2O_3$ layer is approximately 25 nm and the thickness of the low refractive index $SiO_2$ layer is approximately 30 nm.

The dielectric film 380 may be layered on a reflective backing having high reflectance. As a result, the number of layers in the dielectric multilayer film can be decreased, while still achieving high reflectance. Since the number of layers in the dielectric multilayer film is lower than in a case where a reflective backing is not provided, warping of the reflecting portions 240 and 260 caused by the stress of the dielectric multilayer film is reduced.

When the wavelength λ of the incident light is 193 nm, for example, Al or an Al alloy can be used as the material with high reflectance in the reflective backing, for example. Furthermore, although silicon has a lower reflectance than Al, silicon can be used as the material having a relatively high reflectance at 193 nm.

Types of silicon include monocrystalline silicon and amorphous silicon, and amorphous silicon has slightly lower reflectance than monocrystalline silicon. However, amorphous silicon has the benefit of being able to form a thick film with a thickness of several micrometers. Furthermore, both thickness and high reflectance can be achieved in the backing by forming a thin film of an Al alloy on the thick film of amorphous silicon.

In the case of a structure formed by alternately layering a high refractive index layer formed of $Al_2O_3$ and a low refractive index layer formed of $SiO_2$ beginning with $Al_2O_3$ directly on a reflective backing formed of aluminum (Al), for example, a reflectance of 95% or more is realized for 9 or more layers. Furthermore, the reflectance increases as the number of layers is increased, but the rate of increase of the reflectance drops off from the $19^{th}$ layer onward. When also considering the increase in warping of the mirror, the number of layers in the dielectric multilayer film is preferably no greater than 19.

In the embodiments described above, the spatial light modulator 100 was formed by two-dimensionally arranging spatial light modulation elements 200 in which the inclination direction and inclination angle of the reflecting portions 240 can be independently changed. However, when forming the spatial light modulator 100, spatial light modulation elements 200 with another configuration can be used.

As another type of spatial light modulation element 200, an element that changes the optical path of reflected light by changing the height of the reflecting portions 240 relative to the substrate 211 can be used, such as described in U.S. Pat. No. 7,206,117. In this way, when arranging the spatial light modulation elements 200 one-dimensionally or two-dimensionally, a wide range of spatial light modulation elements 200 can be selected that can independently change the position and orientation of the reflecting portions 240.

Figure 74:
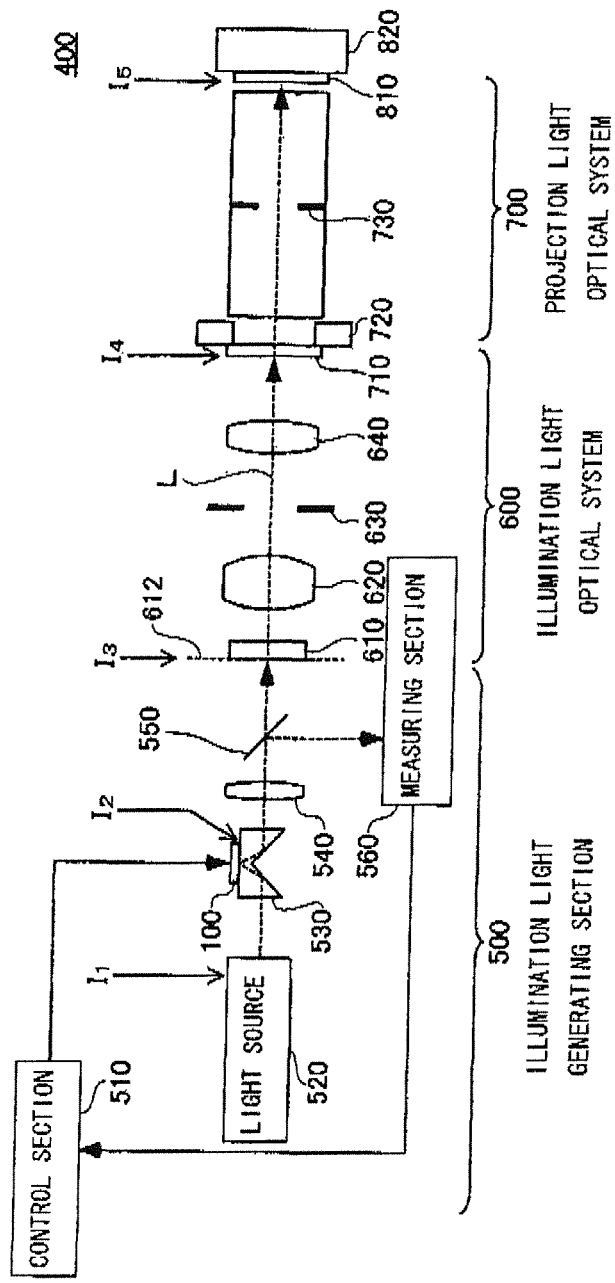
FIG. 74 is a schematic view of the exposure apparatus 400.

FIG. 74 is a schematic view of an exposure apparatus 400 including the spatial light modulator 100. The exposure apparatus 400 includes an illumination light generating section 500, an illumination optical system 600, and a projection optical system 700. The spatial light modulator 100 is arranged in the illumination light generating section 500.

The illumination light generating section 500 includes a control section 510, a light source 520, the spatial light modulator 100, a prism 530, an imaging optical system 540, a beam splitter 550, and a measuring section 560. The light source 520 generates the radiation light L. The radiation light L generated by the light source 520 has an intensity distribution corresponding to characteristics of the light emitting mechanism of the light source 520. Therefore, the radiation light L includes a raw image $I_1$ in a cross-sectional plane orthogonal to the optical path of the radiation light L.

The radiation light L emitted from the light source 520 is incident to the prism 530. The prism 530 guides the radiation light L to the spatial light modulator 100, and then emits the radiation light L to the outside again after being reflected by the spatial light modulator 100. The spatial light modulator 100 modulates the radiation light L incident thereto under the control of the control section 510. The configuration and operation of the spatial light modulator 100 has already been described above in relation to FIG. 42.

The radiation light L emitted from the prism 530 through the spatial light modulator 100 passes through the imaging optical system 540 and is then incident to the illumination optical system 600. The imaging optical system 540 forms an illumination light image $I_3$ in an input surface 612 of the illumination optical system 600.

The beam splitter 550 is arranged in the optical path of the radiation light L, between the imaging optical system 540 and the illumination optical system. The beam splitter 550 splits a portion of the radiation light L prior to being incident to the illumination optical system 600, and guides this split portion to the measuring section 560.

The measuring section 560 measures the image of the radiation light L at a position optically conjugate with the input surface 612 of the illumination optical system 600. In this way, the measuring section 560 measures the image that is the same as the illumination light image $I_3$ incident to the illumination optical system 600. Accordingly, the control section 510 can perform feedback control of the spatial light modulator 100, by referencing the illumination light image $I_3$ measured by the measuring section 560.

The illumination optical system 600 includes a fly eye lens 610, a condenser optical system 620, a field stop 630, and an imaging optical system 640. The emission end of the illumination optical system 600 has a mask stage 720 holding a mask 710 arranged thereon.

The fly eye lens 610 includes a large number of lens elements arranged in parallel with high density, and forms a two-dimensional light source including the same number of illumination light images $I_3$ as the number of lens components on the rear focal surface. The condenser optical system 620 focuses the radiation light L emitted from the fly eye lens 610 and illuminates the field stop 630 in a superimposed manner.

The radiation light L that has passed through the field stop 630 forms an emission light image $I_4$, which is an image of the aperture of the field stop 630, on the pattern surface of the mask 710 due to the imaging optical system 640. In this way, the illumination optical system 600 can perform Kohler illumination with the emission light image $I_4$ on the pattern surface of the mask 710 arranged on the emission end thereof.

The intensity distribution formed at the incident end of the fly eye lens 610, which is also the input surface 612 of the illumination optical system 600, exhibits a high correlation with a global intensity distribution of the overall two-dimensional light source formed on the emission end of the fly eye lens 610. Accordingly, the illumination light image $I_3$ input to the illumination optical system 600 by the illumination light generating section 500 is also exhibited in the emission light image $I_4$, which has the intensity distribution of the radiation light L radiated by the illumination optical system 600 onto the mask 710.

The projection optical system 700 is arranged directly behind the mask stage 720, and includes an aperture stop 730. The aperture stop 730 is arranged at a position that is optically conjugate with the emission end of the fly eye lens 610 of the illumination optical system 600. A substrate stage 820 that holds a substrate 810 having a photosensitive material applied thereto is arranged at the emission end of the projection optical system 700.

The mask 710 held by the mask stage 720 includes a mask pattern formed by a region that reflects or passes the radiation light L emitted by the illumination optical system 600 and a region that absorbs this radiation light L. Accordingly, by radiating the emission light image $I_4$ onto the mask 710, the projection light image $I_5$ is generated by the interaction between the intensity distribution of the emission light image $I_4$ itself and the mask pattern of the mask 710.

The projection light image $I_5$ is projected onto the photosensitive material of the substrate 810, and forms a sacrificial layer having the desired pattern on the surface of the substrate 810. In this way, the exposure apparatus 400 including the spatial light modulator 100 can optimize the light source mask.

In FIG. 74, the optical path of the radiation light L is a straight line, but the exposure apparatus 400 can be miniaturized by bending the optical path of the radiation light L. Furthermore, FIG. 74 shows the radiation light L passing through the mask 710, but a reflective mask 710 may be used instead.

Figure 75:
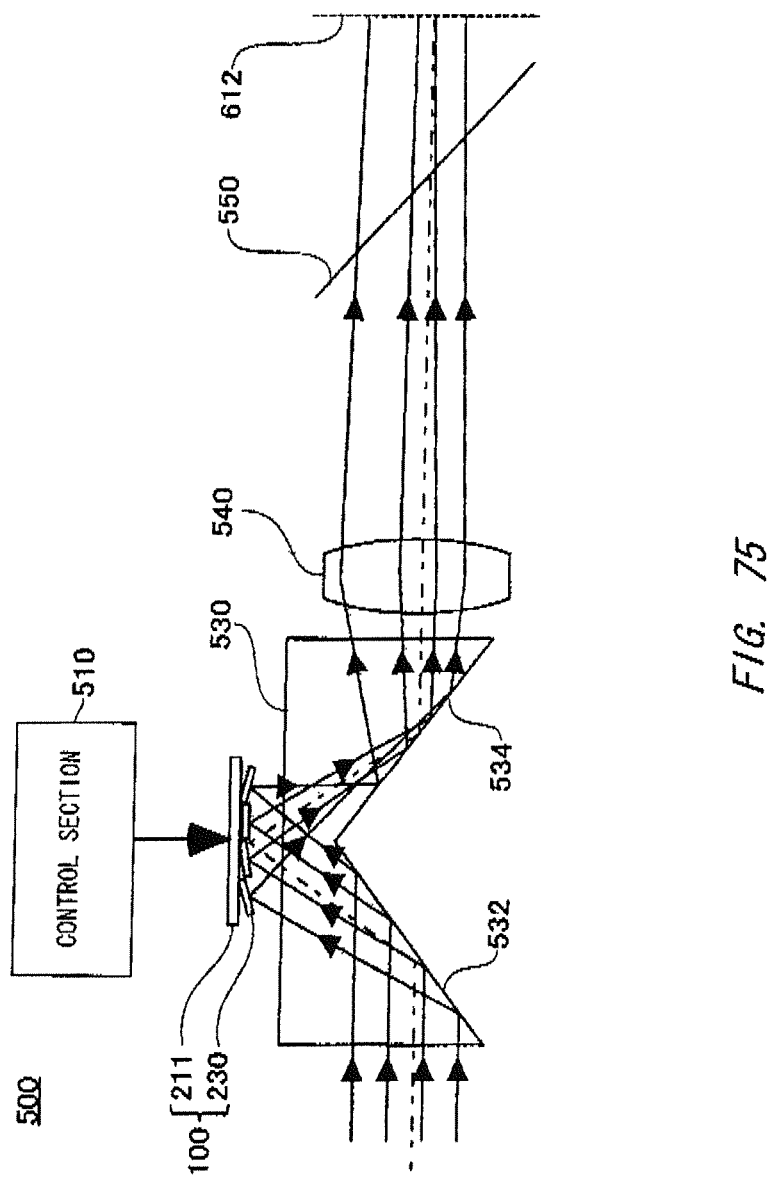
FIG. 75 is a schematic view of the illumination light generating section 500.

FIG. 75 is a partial enlarged view of the illumination light generating section 500, and shows the role of the spatial light modulator 200 in the exposure apparatus 400. The prism 530 includes a pair of reflective surfaces 532 and 534. The radiation light L incident to the prism 530 is radiated toward the spatial light modulator 100 by the one reflective surface 532.

As already described above, the spatial light modulator 100 includes a plurality of reflecting portions 260 that can pivot independently. Accordingly, by having the control section 510 control the spatial light modulator 100, the desired light source image $I_2$ can be formed.

The light source image $I_2$ emitted from the spatial light modulator 100 is reflected by the other reflective surface 534 of the prism 530, and is emitted from the end of the prism 530 on the right side of FIG. 75. The light source image $I_2$ emitted from the prism 530 forms the illumination light image $I_3$ on the input surface 612 of the illumination optical system 600, due to the imaging optical system 540.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A spatial light modulation element comprising:
   a substrate;
   a flat portion that is movable relative to the substrate and includes a lower non-conductive layer, an upper non-conductive layer and a flat structure layer provided between the lower non-conductive layer and the upper non-conductive layer;
   a flat board attached to the upper non-conductive layer of the flat portion; and
   a dielectric film that is formed on a surface of the flat board opposite the surface on which the flat portion is attached, and reflects incident light.

2. The spatial light modulation element according to claim 1, wherein
   the dielectric film includes two or more types of dielectric layers that are repeatedly layered in an alternating manner, such that adjacent layers have different refractive indexes from each other.

3. The spatial light modulation element according to claim 1, wherein thickness of the flat board is greater than thickness of the flat portion.

4. The spatial light modulation element according to claim 3, wherein the flat board is formed by thinning a bulk material.

5. The spatial light modulation element according to claim 1, wherein the dielectric film is formed on a single flat surface of the flat board.

6. The spatial light modulation element according to claim 1, wherein
   the substrate further includes a movable section that moves the flat portion and a connecting section that distances the flat portion from the movable section.

7. A spatial light modulator comprising a plurality of the spatial light modulation elements according to claim 1.

8. An exposure apparatus comprising the spatial light modulator according to claim 7.

9. A spatial light modulation element comprising:
   a substrate;
   a flat portion that is movable relative to the substrate;
   a flat board attached to the flat portion; and
   a dielectric film that is formed on a surface of the flat board opposite the surface on which the flat portion is attached, and reflects incident light, wherein
   the dielectric film is formed by alternately layering an $Al_2O_3$ film and a $SiO_2$ film.

10. The spatial light modulation element according to claim 9, wherein a surface of the flat portion includes a $SiN_x$ thin film.

11. A spatial light modulation element comprising:
    a substrate;
    a flat portion that pivots relative to the substrate;
    a dielectric multilayer film that pivots together with the flat portion, includes a plurality of dielectric layers that are layered in an alternating manner, and reflects incident light; and
    a protective layer that includes the same material as one of the dielectric layers, is thicker than this dielectric layer, and covers at least a portion of a surface of the one dielectric layer that is opposite the flat portion.

12. The spatial light modulation element according to claim 11, wherein
    the protective layer is a barrier against at least one of fluorine, oxygen, and a compound including at least one of fluorine and oxygen.

13. The spatial light modulation element according to claim 11, wherein the protective layer covers the dielectric multilayer film up to side surfaces thereof.

14. The spatial light modulation element according to claim 11, wherein the protective layer includes $Al_2O_3$.

15. The spatial light modulation element according to claim 11, wherein
the protective layer has a thickness that is an integer multiple of a half-wavelength with respect to a wavelength of the incident light reflected by the dielectric multilayer film.

16. A spatial light modulator comprising a plurality of the spatial light modulation elements according to claim 11.

17. An exposure apparatus comprising the spatial light modulator according to claim 16.

18. A spatial light modulation element comprising:
a substrate;
a flat portion that pivots relative to the substrate;
a dielectric multilayer film that pivots together with the flat portion, includes a plurality of dielectric layers that are layered in an alternating manner, and reflects incident light; and
a protective layer that includes the same material as one of the dielectric layers and covers side surfaces of the dielectric multilayer film.

19. The spatial light modulation element according to claim 18, wherein
the protective layer is a barrier against at least one of fluorine, oxygen, and a compound including at least one of fluorine and oxygen.

20. The spatial light modulation element according to claim 18, wherein
the protective layer covers the dielectric multilayer film up to side surfaces thereof.

21. The spatial light modulation element according to claim 18, wherein the protective layer includes $Al_2O_3$.

22. The spatial light modulation element according to claim 18, wherein
the protective layer has a thickness that is an integer multiple of a half-wavelength with respect to a wavelength of the incident light reflected by the dielectric multilayer film.

23. A spatial light modulator comprising a plurality of the spatial light modulation elements according to claim 18.

24. An exposure apparatus comprising the spatial light modulator according to claim 23.

* * * * *